(12) United States Patent
Kim et al.

(10) Patent No.: US 12,520,629 B2
(45) Date of Patent: Jan. 6, 2026

(54) LIGHT-EMITTING DEVICE AND DISPLAY APPARATUS INCLUDING THE SAME

(71) Applicant: SAMSUNG ELECTRONICS CO., LTD., Suwon-si (KR)

(72) Inventors: Hyunjoon Kim, Seoul (KR); Seogwoo Hong, Yongin-si (KR); Kyungwook Hwang, Seoul (KR); Dongkyun Kim, Suwon-si (KR); Joonyong Park, Suwon-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 752 days.

(21) Appl. No.: 17/713,807

(22) Filed: Apr. 5, 2022

(65) Prior Publication Data
US 2023/0131855 A1   Apr. 27, 2023

(30) Foreign Application Priority Data
Oct. 22, 2021 (KR) .................. 10-2021-0141878

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/01* (2025.01);
(Continued)

(58) Field of Classification Search
CPC ............... H10H 20/8312; H10H 20/01; H10H 20/821; H10H 20/857; H10H 20/032;
(Continued)

(56) References Cited

U.S. PATENT DOCUMENTS 6,590,346 B1 * 7/2003 Hadley ............... H01L 23/5389
257/E21.705
9,825,202 B2   11/2017 Schuele et al.
(Continued)

FOREIGN PATENT DOCUMENTS

CN      104620400 A    5/2015
CN      113261118 A    8/2021
(Continued)

OTHER PUBLICATIONS

Communication dated Oct. 12, 2022 issued by the European Patent Office in counterpart European Patent Application No. 22169950.7.
(Continued)

*Primary Examiner* — Su C Kim
(74) *Attorney, Agent, or Firm* — Sughrue Mion, PLLC

(57) ABSTRACT

A light-emitting device and a display apparatus including the light-emitting device are provided. The light-emitting device includes a light-emitting cell including first and second electrodes arranged on an upper surface to be apart from each other, an extended layer in which the light-emitting cell is embedded and which has a width greater than a width of the light-emitting cell, and first and second electrode pads arranged on an upper surface of the extended layer to be apart from each other and respectively electrically connected to the first and second electrode.

22 Claims, 33 Drawing Sheets

(51) Int. Cl.
   *H10H 20/01*   (2025.01)
   *H10H 20/821*  (2025.01)
   *H10H 20/857*  (2025.01)

(52) U.S. Cl.
   CPC ........ *H10H 20/821* (2025.01); *H10H 20/857* (2025.01); *H10H 20/032* (2025.01); *H10H 20/0364* (2025.01)

(58) Field of Classification Search
   CPC ............ H10H 20/0364; H10H 20/853; H10H 20/819; H10H 20/813; H10H 20/831; H01L 25/0753; H10D 86/441
   See application file for complete search history.

(56) References Cited

U.S. PATENT DOCUMENTS

| | | | |
|---|---|---|---|
| 9,985,190 | B2 | 5/2018 | Zhan et al. |
| 10,777,714 | B2 | 9/2020 | Sasaki et al. |
| 2012/0091594 | A1* | 4/2012 | Landesberger ......... H01L 24/83 257/E23.068 |
| 2015/0155441 | A1 | 6/2015 | Alexeev et al. |
| 2018/0323178 | A1* | 11/2018 | Meitl .................. H01L 25/0753 |
| 2019/0067255 | A1 | 2/2019 | Lim et al. |
| 2019/0165226 | A1* | 5/2019 | Kim ....................... H01L 33/32 |
| 2020/0091383 | A1 | 3/2020 | Sasaki et al. |
| 2020/0212262 | A1 | 7/2020 | Jang et al. |
| 2020/0227395 | A1 | 7/2020 | Shi et al. |
| 2020/0251451 | A1 | 8/2020 | Schuele et al. |
| 2020/0365648 | A1 | 11/2020 | Jang et al. |
| 2022/0189931 | A1 | 6/2022 | Hwang et al. |
| 2022/0230997 | A1 | 7/2022 | Choi |
| 2022/0285188 | A1 | 9/2022 | Kim et al. |
| 2022/0406981 | A1 | 12/2022 | Yamazaki et al. |
| 2024/0322081 | A1 | 9/2024 | Jang et al. |

FOREIGN PATENT DOCUMENTS

| | | |
|---|---|---|
| JP | 2020-68313 A | 4/2020 |
| KR | 10-2017-0099324 A | 8/2017 |
| KR | 10-2019-0088929 A | 7/2019 |
| KR | 10-2019-0093494 A | 8/2019 |
| KR | 10-2021-0099063 A | 8/2021 |
| KR | 10-2022-0085687 A | 6/2022 |
| TW | 201338201 A | 9/2013 |
| WO | 2020/251076 A1 | 12/2020 |
| WO | 2021/099880 A1 | 5/2021 |

OTHER PUBLICATIONS

Matthew S. Wong et al., "Size-independent peak efficiency of III-nitride micro-light-emitting-diodes using chemical treatment and sidewall passivation", Applied Physics Express, 12, 097004, 2019, 5 pages total.
Ajit Paranjpe et al., "Micro-LED Displays: Key Manufacturing Challenges and Solutions", SID 2018 Digest, 2018, 4 pages total.
Communication dated Aug. 1, 2024, issued by the Korean Patent Office in Korean Application No. 10-2021-0141878.
Communication dated Aug. 6, 2025, issued by the Chinese Patent Office in counterpart Chinese Application No. 202210895487.9.

* cited by examiner

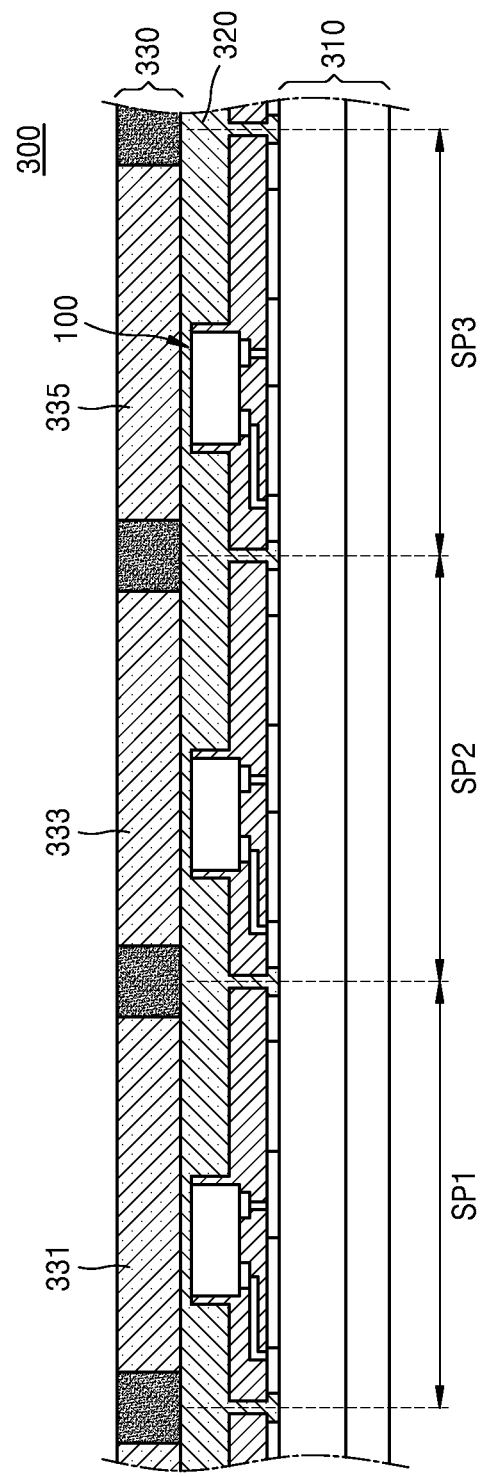

LIGHT-EMITTING DEVICE AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0141878, filed on Oct. 22, 2021, in the Korean Intellectual Property Office, the disclosure of which is incorporated by reference herein in its entirety.

BACKGROUND

1. Field

Apparatuses and methods consistent with example embodiments relate to a light-emitting device, a display apparatus including the light-emitting device, and a method of manufacturing the display apparatus.

2. Description of the Related Art

Light-emitting devices (LEDs) have been known as a next generation light source having advantages such as long lifespan, low consumption power, a fast response speed, environmental friendliness, and the like, compared with a light source according to the related art, and used as various products such as lighting apparatuses, backlights of display apparatuses, and the like. In particular, group III nitride-based LEDs such as gallium nitride (GaN), aluminum gallium nitride (AlGaN), indium gallium nitride (InGaN), indium aluminum gallium nitride (InAlGaN), and the like are used as light-emitting devices for outputting light.

SUMMARY

One or more example embodiments provide a light-emitting device that has a chip coverage extending beyond a light-emitting cell and a method of manufacturing the same.

Further, one or more example embodiments provide a display apparatus including an extended light-emitting device and a method of manufacturing the same.

According to an aspect of the disclosure, a light-emitting cell includes a first electrode and a second electrode that are provided on an upper surface of the light-emitting cell; an extended layer in which the light-emitting cell is embedded and which has a width greater than a width of the light-emitting cell; and a first electrode pad and a second electrode pad that are provided on an upper surface of the extended layer, and are electrically connected to the first electrode and the second electrode, wherein an interval between the first electrode pad and the second electrode pad is greater than an interval between the first electrode and the second electrode, and at least one of the first electrode or the second electrode does not entirely overlap the first electrode pad and the second electrode pad, in a thickness direction of the light-emitting device.

The first electrode pad is provided on a center axis of the extended layer, and the second electrode pad surrounds the first electrode pad.

The second electrode pad may not overlap the first electrode and the second electrode in the thickness direction of the light-emitting device.

At least one of the first electrode pad or the second electrode pad may be symmetrical to a center axis of the light-emitting device.

At least one of the first electrode pad or the second electrode pad is line symmetrical or rotationally symmetrical to the center axis of the light-emitting device.

The interval between the first electrode pad and the second electrode pad is 1.5 times or more than the interval between the first electrode and the second electrode.

A width of at least one of the first electrode pad or the second electrode pad is greater than a width of the first electrode and the second electrode.

A center axis of the light-emitting device may not match a center axis of the light-emitting cell.

The light-emitting cell has a rotational asymmetric shape with respect to a center axis of the light-emitting cell.

The light-emitting cell has a polygonal cross-sectional shape.

The first electrode and the second electrode are spaced apart from each other with a center axis of the light-emitting cell therebetween.

The extended layer includes a first region arranged at a center of the light-emitting device and a second region surrounding the first region, and the light-emitting cell is embedded in the first region.

Furthermore, the light-emitting cell may be embedded in the first region.

Furthermore, the thickness of the first region may be different from the thickness of the second region.

Furthermore, the thickness of the first region may be greater than the thickness of the second region.

Furthermore, the light-emitting device may further include a first through-electrode penetrating the extended layer and having one end in contact with the first electrode and the other end in contact with the first electrode pad, and a second through-electrode penetrating the extended layer and having one end in contact with the second electrode and the other end in contact with the second electrode pad.

Furthermore, at least one of the first through-electrode or the second through-electrode may be bent once or more.

Furthermore, a partial area of the second through-electrode may overlap the first electrode pad in the thickness direction of the light-emitting device.

Furthermore, the light-emitting cell may include a plurality of sub-light-emitting cells that emit light of different wavelengths, and each of the first and second electrode pads may include a plurality of sub electrode pads respectively electrically connected to the plurality of sub-light-emitting cells.

According to another aspect of the disclosure, a display apparatus may include: a display layer including a plurality of light-emitting devices; and a driving layer including a plurality of transistors electrically connected to the plurality of light-emitting devices to drive the plurality of light-emitting devices, wherein at least one of the plurality of light-emitting devices may include: a light-emitting cell including a first electrode and a second electrode provided on an upper surface of the at least one of the plurality of light-emitting devices; an extended layer in which the light-emitting cell is embedded and which has a width greater than a width of the light-emitting cell; a first electrode pad and a second electrode pad provided on an upper surface of the extended layer and respectively electrically connected to the first electrode and the second electrode, and wherein an interval between the first electrode pad and the second electrode pad is greater than an interval between the first electrode and the second electrode, and at least one of the first electrode or the second electrode does not entirely overlap the first electrode pad and the second electrode pad, in a thickness direction of the at least one of the plurality of light-emitting devices.

The display layer may further include a partition wall provided on the driving layer and having a plurality of holes, the light-emitting cell is provided in one of the plurality of holes, and an edge region of the extended layer is arranged on an upper surface of the partition wall.

Furthermore, the light-emitting cell may be arranged spatially apart from the driving layer.

According to another aspect of the disclosure, a display apparatus may include: a light-emitting cell comprising a plurality of electrodes; an extension layer that covers a top surface of the light-emitting cell and the plurality of electrodes of the light-emitting cell; a first electrode pad and a second electrode pad that are provided on the top surface of the extension layer, wherein the first electrode pad is disposed directly above the light-emitting cell, and the second electrode pad has a circular ring shape to surround the first electrode pad; and a plurality of through-electrodes that pass through the extension layer to connect the first electrode pad and the second electrode pad to the plurality of electrodes of the light-emitting cell, respectively, wherein the first electrode pad and the second electrode pad are spaced from the light-emitting cell in a vertical direction of the display apparatus, and an interval between the first electrode pad and the second electrode pad is greater than an interval between the plurality of electrodes of the light-emitting cell in a horizontal direction of the display apparatus.

According to another aspect of the disclosure, a method of manufacturing a light-emitting device may include: preparing a substrate comprising a plurality of grooves; transferring each of a plurality of light-emitting cells to the plurality of grooves such that a first electrode and a second electrode of each of the plurality of light-emitting cells are spaced apart faces out of the grooves; forming a first through-electrode, a second through-electrode and an extended layer on the surface of each of the plurality of light-emitting cells, each of the first through-electrode and the second through-electrode in contact with the first electrode and the second electrode; forming a first electrode pad and a second electrode pad on the extended layer, each of first electrode pad and second electrode pad in contact with the first through-electrode and the second through-electrode, wherein an interval between the first electrode pad and the second electrode pad is greater than an interval between the first electrode and the second electrode, and at least one of the first electrode or the second electrode does not entirely overlap the first electrode pad and the second electrode pad, in a thickness direction of the light-emitting device.

Furthermore, the first electrode pad may be disposed on a center axis of the extended layer, and the second electrode pad surrounds the first electrode pad.

Furthermore, the second electrode pad may not overlap the first electrode and the second electrode in the thickness direction of the light-emitting device.

Furthermore, a width of at least one of the first electrode pad or the second electrode pad may be greater than a width of the first electrode and the second electrode.

Furthermore, a center axis of the light-emitting device may not match a center axis of the light-emitting cell.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 3A to 3E are reference views showing a method of manufacturing a display apparatus by using a light-emitting device, according to an example embodiment;

DETAILED DESCRIPTION

Figure 1A:
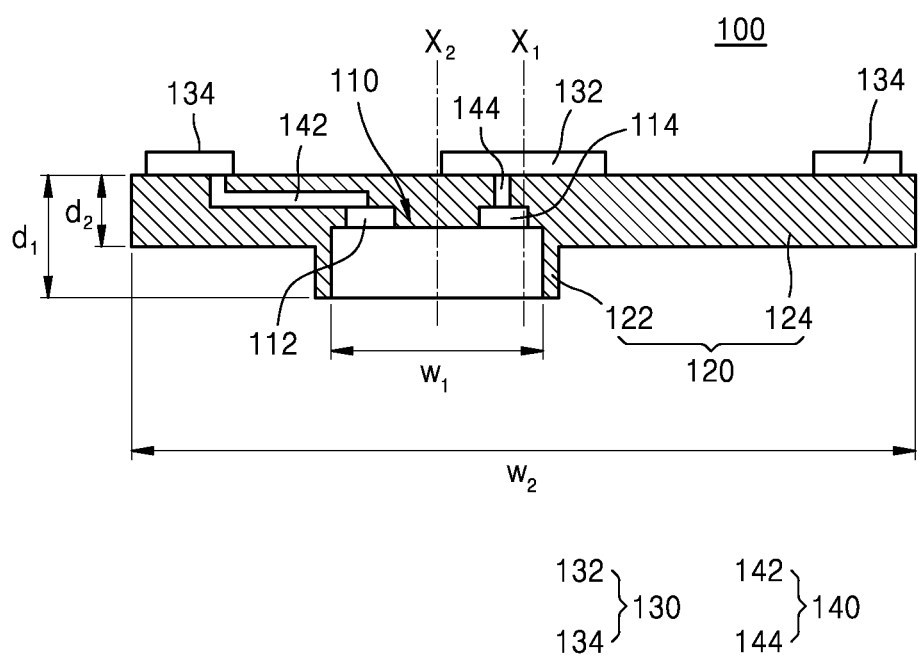
FIG. 1A is a cross-sectional view showing a light-emitting device according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments are described in detail with reference to the accompanying drawings. The described embodiments are merely exemplary, and various modifications from the embodiments are possible. Throughout the drawings, like reference numerals refer to like elements. The thickness or size of each layer illustrated in the drawings may be exaggerated for convenience of explanation and clarity.

In a layer structure, when a constituent element is disposed "above" or "on" to another constituent element, the constituent element may be only directly on the other constituent element or above the other constituent elements in a non-contact manner.

Terms such as "first" and "second" are used herein merely to describe a variety of constituent elements, but the constituent elements are not limited by the terms. Such terms are used only for the purpose of distinguishing one constituent element from another constituent element. The terms do not limit that the material or structure of the constituent elements are different from one another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components.

Furthermore, terms such as " . . . portion," " . . . unit," " . . . module," and " . . . block" stated in the specification may signify a unit to process at least one function or operation and the unit may be embodied by hardware, software, or a combination of hardware and software.

The use of the terms "a" and "an" and "the" and similar referents in the context of describing the disclosure are to be construed to cover both the singular and the plural.

Also, the steps of all methods described herein can be performed in any suitable order unless otherwise indicated herein or otherwise clearly contradicted by context. The disclosure is not limited to the described order of the steps. Furthermore, the use of any and all examples, or language (e.g., "such as") provided herein, is intended merely to better illuminate the disclosure and does not pose a limitation on the scope of the disclosure unless otherwise claimed.

Figure 1B:
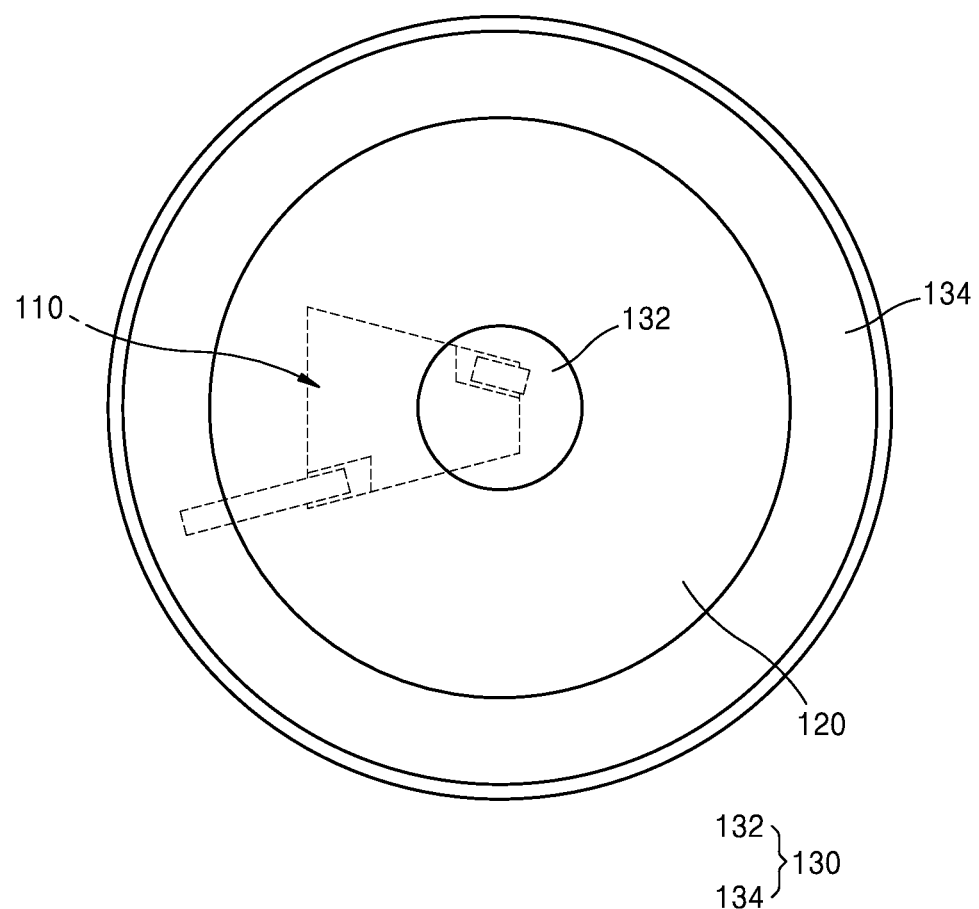
FIG. 1B illustrates the light-emitting device of FIG. 1A when viewed from above.

FIG. 1A is a cross-sectional view of a light-emitting device 100 according to an example embodiment. FIG. 1B illustrates the light-emitting device 100 of FIG. 1A when viewed from above.

As illustrated in FIG. 1A, the light-emitting device 100 may include a light-emitting cell 110, an extended layer 120 in which the light-emitting cell 110 is embedded and which has a width $w_2$ greater than a width $w_1$ of the light-emitting cell 110. A plurality of electrode pads 130 are arranged on an upper surface of the extended layer 120 and are spaced apart from each other and electrically connected to the light-emitting cell 110. A center axis $X_1$ of the extended layer 120 may not match the center axis $X_2$ of the light-emitting cell 110.

The light-emitting cell 110 may include an inorganic material-based light-emitting diode, and the light-emitting cell 110 may emit light of a specific wavelength according to a containing material. The light-emitting cell 110 may be micro-sized. For example, the width $w_1$ of the light-emitting cell 110 may be about 100 μm or less.

The light-emitting cell 110 may include a plurality of semiconductor layers. For example, the light-emitting cell 110 may include a first semiconductor layer, an active layer, and a second semiconductor layer. The first semiconductor layer may include, for example, an n-type semiconductor. However, the disclosure is not necessarily limited thereto, and in some cases, the first semiconductor layer may include a p-type semiconductor. The active layer may be arranged on the first semiconductor layer, may generate light as electrons and holes combine with each other, and may have a multi-quantum well (MQW) structure or a single-quantum well (SQW) structure. The second semiconductor layer may be provided on the active layer, and may include a semiconductor layer having a type different from the first semiconductor layer.

The light-emitting cell 110 may further include a plurality of electrodes that are arranged on one surface of the light-emitting cell 110 to be spaced apart from each other. For example, first and second electrodes 112 and 114 may be arranged on the same surface of the light-emitting cell 110 to be spaced apart from each other. The first electrode 112 may be electrically connected to the first semiconductor layer, and the second electrode 114 may be electrically connected to the second semiconductor layer. The first and second electrodes 112 and 114 may not be arranged on the center axis $X_2$ of the light-emitting cell 110. For example, the first and second electrodes 112 and 114 may be arranged spaced apart from each other with the center axis $X_2$ of the light-emitting cell 110 therebetween.

The first and second electrodes 112 and 114 may include a conductive material. For example, the first and second electrodes 112 and 114 may include a transparent conductive material. The first and second electrodes 112 and 114 may include a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as poly (3,4-ethylenedioxythiophene) (PEDOT), and the like.

The width $w_1$ of the light-emitting cell 110 may be about 5 μm or more and about 100 μm or less. The light-emitting cell 110 may be produced by a method of, for example, growing the light-emitting cell 110 on a wafer such as sapphire, silicon, or the like, and then detaching the light-emitting cell 110 by using laser or an etching solution. When the light-emitting cell 110 is too small, for example, the width $w_1$ of the light-emitting cell 110 is less than 5 μm, it is difficult to produce the light-emitting cell 110 having good quality due to surface current leakage. Furthermore, when a display apparatus is manufactured by using a small light-emitting cell, there is a problem that electrical connection failure increases.

When the width $w_1$ of the light-emitting cell 110 is relatively large, for example, the width $w_1$ of the light-emitting cell 110 is about 100 μm or more, the light-emitting cell 110 having good quality may be produced, but the number of light-emitting cells to be produced from a single wafer decreases. This may increase the cost of manufacturing an apparatus including the light-emitting cell 110, for example, a display apparatus.

Accordingly, there is a need to reduce electrical connection failure while minimizing or avoiding cost increases. To this end, the light-emitting device 100 according to an example embodiment may further include the extended layer 120 that includes the light-emitting cell 110 and has a width greater than the width $w_1$ of the light-emitting cell 110.

The width $W_2$ of the extended layer 120 at its maximum may be about 1.5 times or more than the width $w_1$ of the light-emitting cell 110. As the width $W_2$ of the extended layer 120 increases, the width of the light-emitting device 100 may increase as well. However, the light-emitting device 100 performs a function as a sub-pixel of a display, and thus, as the size of the light-emitting device 100 increases, it may be difficult to implement a high resolution of the display. Thus, the width $W_2$ of the extended layer 120 at its maximum may be about 500 μm or less.

The extended layer 120 may include a first region 122 arranged at a center area or a recessed area, and a second region 124 surrounding a side surface of the first region 122. The first region 122 may have a first thickness $d_1$, and the second region 124 may have a second thickness $d_2$. For example, the first thickness $d_1$ may be greater than the second thickness $d_2$. The light-emitting cell 110 may be included in a lower area of the first region 122, and at least partial areas of a side surface and an upper surface of the light-emitting cell 110 may be in contact with the first region 122, and a lower surface of the light-emitting cell 110 may be exposed to the outside.

The extended layer 120 may include an insulating material. The extended layer 120 may include an organic insulating film (an acryl or silicon-based polymer) or an inorganic insulating film ($SiO_2$, SiN, $Al_2O_3$ or $TiO_2$), and the like, but the disclosure is not limited thereto. The extended layer 120 may have a multilayer structure including a plurality of insulating materials having different dielectric constants.

The light-emitting device 100 may further include the electrode pads 130 that are arranged on the upper surface of the extended layer 120 to be spaced apart from each other. The electrode pads 130 may include a first electrode pad 132 electrically connected to the first electrode 112 and a second electrode pad 134 electrically connected to the second electrode 114. Furthermore, the light-emitting device 100 may further include a plurality of through-electrodes 140 passing through the extended layer 120. For example, the through-electrodes 140 may include a first through-electrode 142 passing through the extended layer 120 and having one end in contact with the first electrode 112 and the other end in contact with the first electrode pad 132, and a second through-electrode 144 passing through the extended layer 120 and having one end in contact with the second electrode 114 and the other end in contact with the second electrode pad 134.

Each of the first and second electrode pads 132 and 134 and the first and second through-electrodes 142 and 144 may include a conductive material. At least one of the first or second electrode pad 132 and 134 and the first and second through-electrodes 142 and 144 may include a transparent conductive material. At least one of the first or second electrode pad 132 and 134 and the first and second through-electrodes 142 and 144 may include a metal such as Ag, Mg, Al, Pt, Pd, Au, Ni, Nd, Ir, Cr, or an alloy thereof, a conductive oxide such as ITO, IZO, ZnO, or ITZO, a conductive polymer such as PEDOT, and the like.

At least one of the first and second through-electrodes 142 and 144 may include a region that is bent once or more, or a region inclined in a direction to an edge of the light-emitting device 100. Accordingly, the interval between the first and second electrode pads 132 and 134 may be greater than the interval between the first and second electrodes 112 and 114. At least one of the first and second electrodes 112 and 114 may not overlap the first and second electrode pads 132 and 134, as a whole, in a direction along the thickness $d_1$ of the light-emitting device 100. An interval between connector electrodes of the light-emitting device 100 may be increased due to the first and second through-electrodes 142 and 144 being added to the light-emitting device 100 and having electric connections to the first and second electrode pads 132 and 134, and also due to the second through-electrode 144 that partially overlaps the first electrode pad 132 in the direction of the width $w_2$ of the light-emitting device 100. The width of at least one of the first or second electrode pad 132 and 134 may be greater than the widths of the first and second electrodes 112 and 114. Accordingly, the first and second electrode pads 132 and 134 may reduce defects caused by process errors during an electrode connection process.

At least one of the first or second electrode pad 132 and 134 may be symmetrical with respect to the center axis $X_1$ of the upper surface of the extended layer 120, or may be in symmetrical positions with respect to the center axis $X_1$. At least one of the first or second electrode pad 132 and 134 may be rotationally symmetrical or line symmetrical with respect to the center axis $X_1$ of the upper surface of the extended layer 120. For example, the first electrode pad 132 may be arranged on the center axis $X_1$ of the upper surface of the extended layer 120, whereas the second electrode pad 134 may be arranged apart by a certain distance from the center axis $X_1$ of the upper surface of the extended layer 120. As the first and second electrode pads 132 and 134 are arranged symmetrically with respect to the center axis $X_1$ of the upper surface of the extended layer 120, a transfer direction may not be considered when the light-emitting device 100 according to an example embodiment is transferred to another substrate and the like.

The extended layer 120 may function as a base layer for forming the first and second electrode pads 132 and 134 thereon, but also as a collector for collecting light emitted from the light-emitting device 100. For example, the light emitted in a side surface direction of the light-emitting cell 110 may be totally reflected by the side surface of the first region 122 to be emitted through a front surface the light-emitting device 100. The concentration of light may vary depending on the width of the first region 122. In addition, the second region 124 of the extended layer 120 may function as a guide when the light-emitting device 100 is transferred to another substrate.

FIGS. 2A to 2D are reference views showing a method of manufacturing the light-emitting device 100, according to an example embodiment.

Figure 2A:
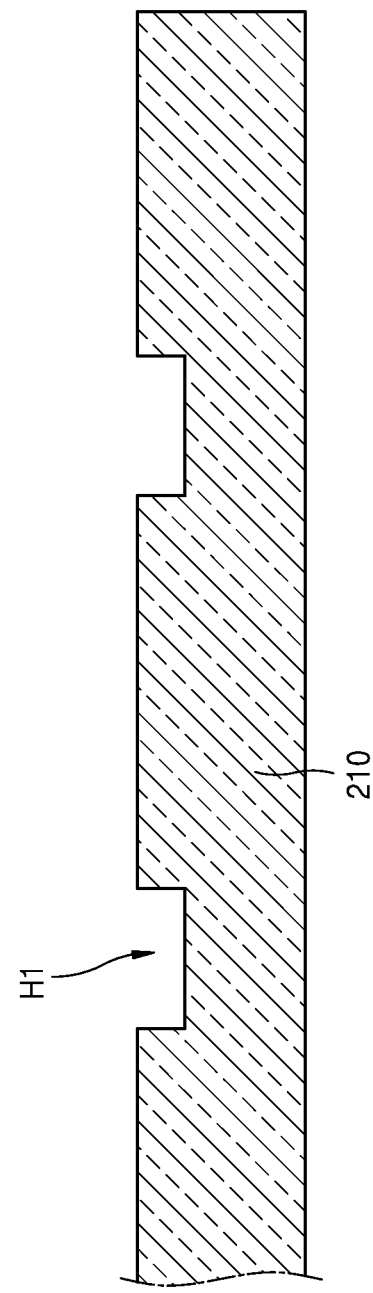
FIGS. 2A to 2D are reference views showing a method of manufacturing a light-emitting device, according to an example embodiment.

As illustrated in FIG. 2A, a substrate 210 may be prepared. The substrate 210 may be a single body or single mold structure including a plurality of grooves H1. The substrate 210 may include, for example, an organic material, an inorganic material such as silicon, glass, sapphire, and polymer, and/or a metal, and may be manufactured by a method such as photoresist patterning, etching, molding, and the like, but the disclosure is not limited thereto. The grooves H1 may guide a transfer of the light-emitting cell 110 when the light-emitting cell 110 is transferred to the substrate 210.

The grooves H1 may each have a cross-sectional area greater than the area of the light-emitting cell 110 to accommodate the light-emitting cell 110 inside each of the grooves H1. The grooves H1 may have a shape similar to the cross-section of the light-emitting cell 110, for example, a circular cross-section or a polygonal cross-section. The grooves H1 may have a depth less than or greater than the thickness of the light-emitting cell 110, for example, a depth less than twice, or in a range of about 0.5 to 1.5 times, the thickness of the light-emitting cell 110.

Figure 2B:
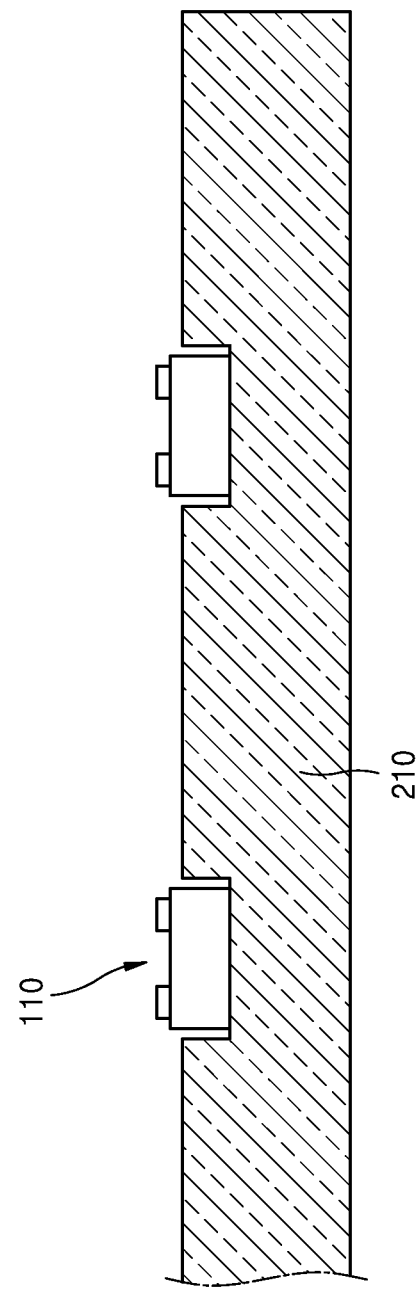

As illustrated in FIG. 2B, a plurality of light-emitting cells 110 may be transferred to the substrate 210. The light-emitting cell 110 may be supplied to the substrate 210 as being included in suspension. A method of supplying a light-emitting cell included in suspension may include various methods such as a spray method, a dispensing method of releasing a liquid drop by drop, an inject dot method of ejecting a liquid like a printing method, a method of flowing suspension to the substrate 210, and the like. In a transfer process, the light-emitting cell 110 may be seated in the grooves H1 by a surface energy difference, a complementary shape between the grooves H1 and the light-emitting cell 110, or the like. The light-emitting cell 110 may be seated in the grooves H1 such that a surface on which the first and second electrode are spaced apart faces out of the groove.

The light-emitting cell 110 is transferred by a fluidic self-assembly method. However, the disclosure is not limited thereto, and the light-emitting cell 110 according to an example embodiment may be transferred by various methods such as a pick and place method and the like.

Figure 2C:
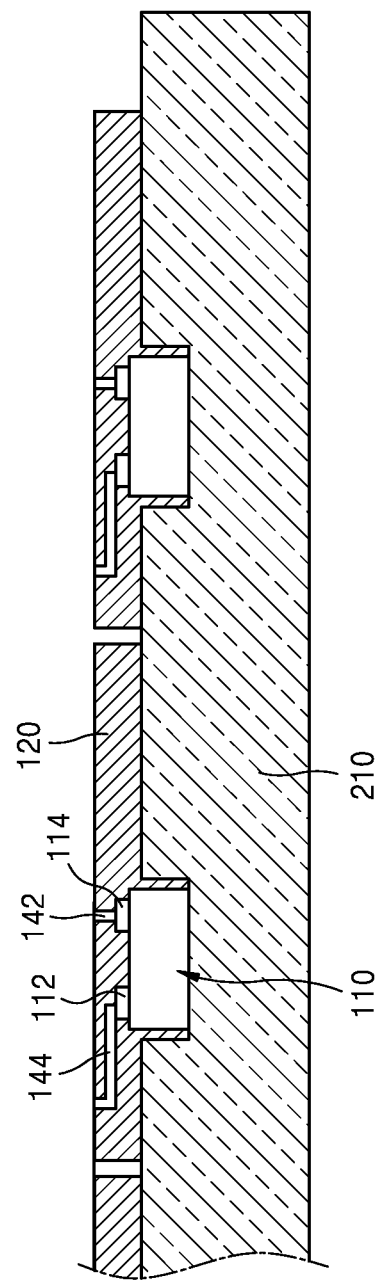

As illustrated in FIG. 2C, the first and second through-electrodes 142 and 144 and the extended layer 120 may be formed on the substrate 210 to which the light-emitting cell 110 is transferred. The first and second through-electrodes 142 and 144 and the extended layer 120 may be formed by alternately depositing a conductive material and an insulating material by using a mask. A lower end of each of the first through-electrode 142 and the second through-electrode 144 may be in contact with the first electrode 112 and the second electrode 114, respectively. While the first and second through-electrodes 142 and 144 and the extended layer 120 are formed, the first through-electrode 142 and the second through-electrode 144 may be formed such that the interval therebetween gradually increases. At least one of the first and second through-electrodes 142 and 144 may be bent once or more, and at least one of the first and second through-electrodes 142 and 144 may extend in a direction toward the edge of the light-emitting cell 110 to be farther away from the light-emitting cell 110.

Figure 2D:
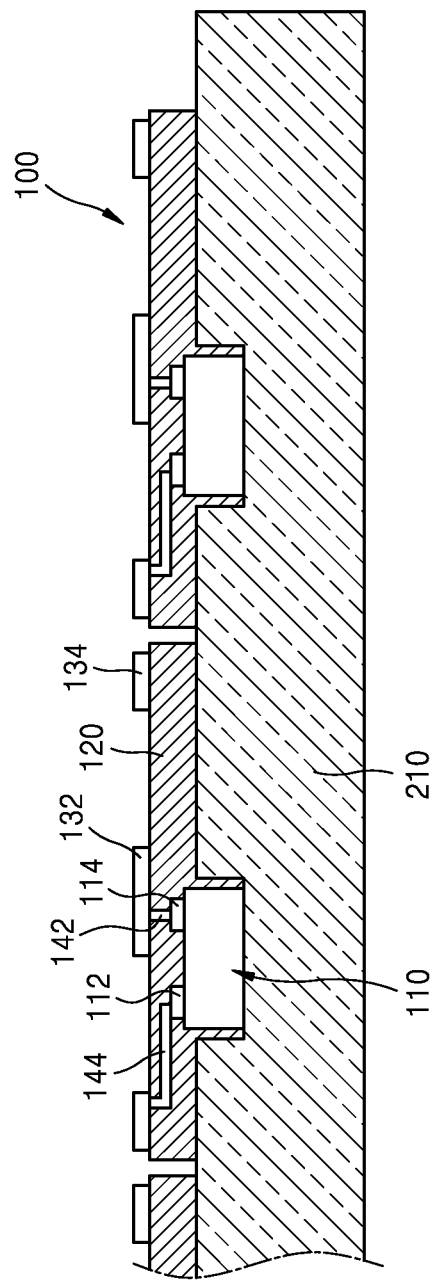

As illustrated in FIG. 2D, the first and second electrode pads 132 and 134 may be formed on the upper surface of the extended layer 120. The first electrode pad 132 may be in contact with the first through-electrode 142, and the second electrode pad 134 may be in contact with the second through-electrode 144. As the first electrode pad 132 is arranged on the center axis $X_1$ of the upper surface of the extended layer 120 and the second electrode pad 134 is arranged at the edge of the extended layer 120, the interval between the first and second electrode pads 132 and 134 may be greater than the interval between the first and second electrodes 112 and 114. At least one of the first and second electrodes 112 and 114 may not overlap the first and second electrode pads 132 and 134 in the thickness direction of the extended layer 120. The width of at least one of the first or second electrode pad 132 and 134 may be greater than the widths of the first and second electrodes 112 and 114. Accordingly, by using the first and second electrode pads 132 and 134, instead of the first and second electrodes 112 and 114, process errors during an electrode connection process may be reduced.

FIGS. 3A to 3E are reference views showing a method of manufacturing a display apparatus by using the light-emitting device 100, according to an example embodiment.

Figure 3A:
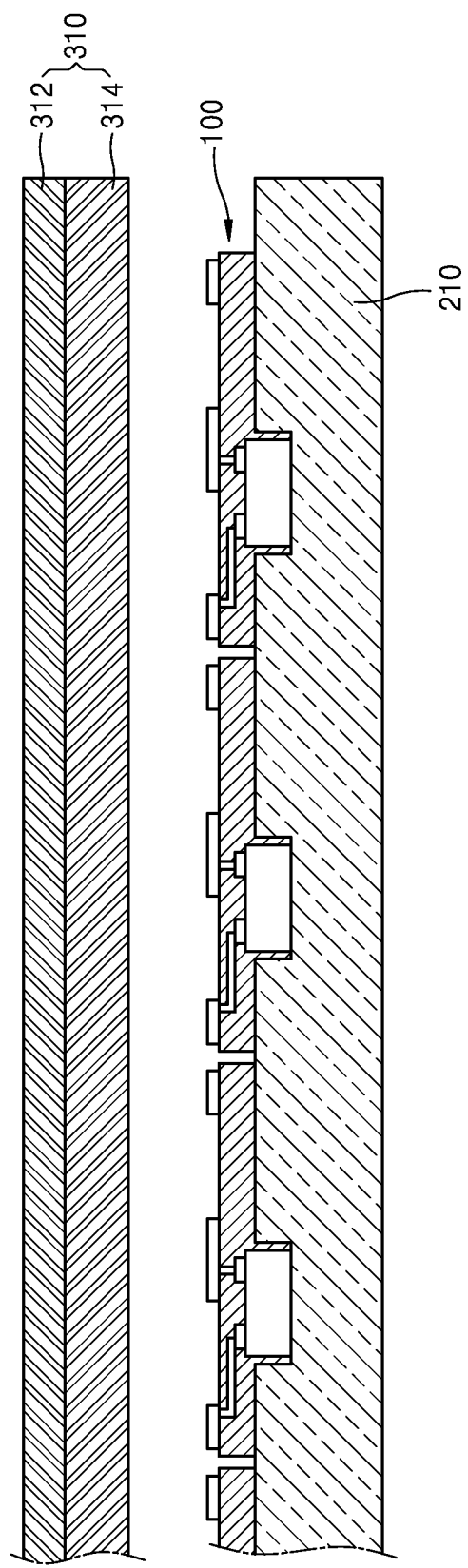

Referring to FIG. 3A, a target substrate 310 may be aligned above the substrate 210 on which the light-emitting device 100 is formed. The target substrate 310 may include a substrate 312 and a driving layer 314. The substrate 312 may include an insulating material such as glass, organic polymer, crystal, and the like. Furthermore, the substrate 312 may include a material having flexibility so as to be bendable or foldable, and may have a single layer structure or a multilayer structure. The driving layer 314 may include transistors for driving the light-emitting devices 100, electrode patterns, and the like. The electrode pads of the light-emitting device 100 may be arranged to face the electrode patterns formed on the target substrate 310.

Figure 3B:
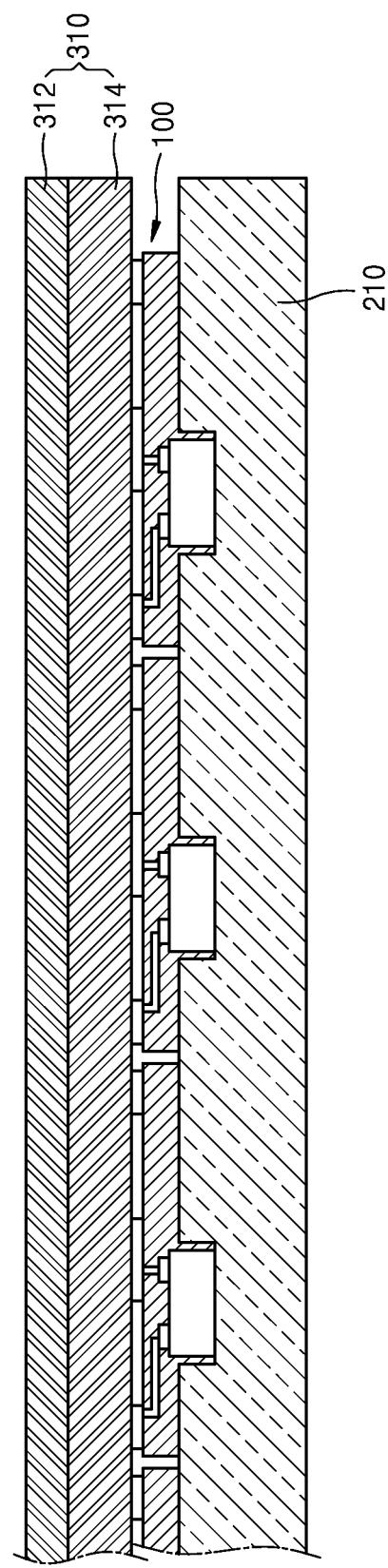

As illustrated in FIG. 3B, the light-emitting device 100 may be transferred to the target substrate 310. For example, the light-emitting device 100 may be transferred to the target substrate 310 by a bonding method. After the substrate 210 and the target substrate 310 are aligned with each other, the light-emitting device 100 may be bonded to the target substrate 310 by using thermo-compression, ultrasound, or light such as laser, ultra violet (UV) light, or the like. For example, when thermo-compression is applied between the electrode pads of the light-emitting device 100 and the electrode patterns of the target substrate 310, eutectic bonding may be formed between the electrode pads of the light-emitting device 100 and the electrode patterns of the target substrate 310 to combine the electrode pads of the light-emitting device 100 and the electrode patterns of the target substrate 310.

Figure 3C:
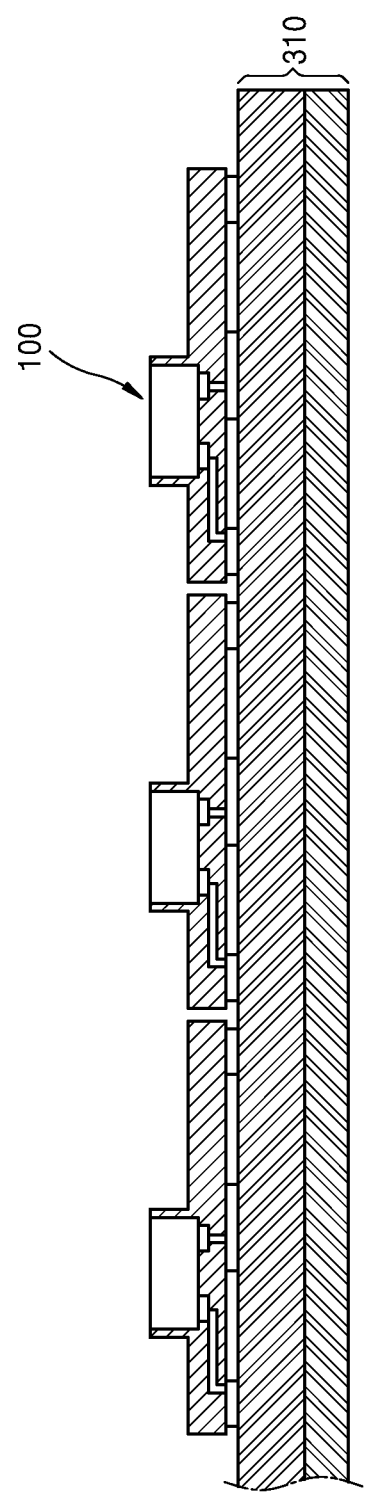

After the light-emitting device 100 is transferred to the target substrate 310, the substrate 210 may be removed. As illustrated in FIG. 3C, the position of the target substrate 310 may be changed such that the light-emitting device 100 is positioned above.

Figure 3D:
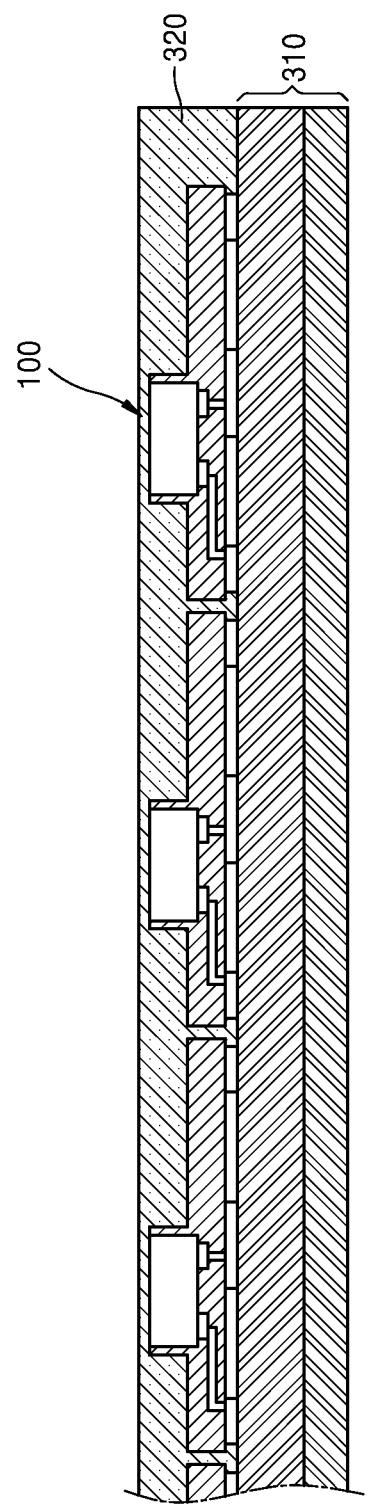

As illustrated in FIG. 3D, a planarization layer 320 may be formed on the light-emitting device 100. The planarization layer 320 may have a flat upper surface, covering the light-emitting device 100. The planarization layer 320 may alleviate a step generated due to constituent elements located under the planarization layer 320, and prevent infiltration of oxygen, moisture, and the like into the light-emitting device 100. The planarization layer 320 may include an insulating material. The planarization layer 320 may include an organic insulating film (e.g., an acryl or silicon-based polymer film) or an inorganic insulating film (including $SiO_2$, SiN, $Al_2O_3$, or $TiO_2$), and the like, but the disclosure is not limited thereto. The planarization layer 320 may have a multilayer structure including a plurality of insulating materials having different dielectric constants.

As illustrated in FIG. 3E, a color conversion layer 330 may be formed on the planarization layer 320. When the light-emitting device 100 emits light of the same wavelength, the color conversion layer 330 may include first to third color conversion patterns 331, 333, and 335 that convert light generated from the light-emitting device 100 to light of a certain wavelength. Each of the first to third color conversion patterns 331, 333, and 335 may correspond to each sub-pixel. For example, the first color conversion pattern 331 may correspond to a first sub-pixel SP1, the second color conversion pattern 333 may correspond to a second sub-pixel SP2, and the third color conversion pattern 334 may correspond to a third sub-pixel SP3.

Although FIG. 3E illustrates that the light-emitting device 100 emits light of the same wavelength, the disclosure is not limited thereto. When the light-emitting devices 100 emit different light rays, for example, red, blue, and green light rays, functioning as sub-pixels, the color conversion layer 330 may not be formed.

FIGS. 4A to 4E are reference views showing a process of manufacturing a display apparatus by using the light-emitting device 100, according to another example embodiment.

Figure 4A:
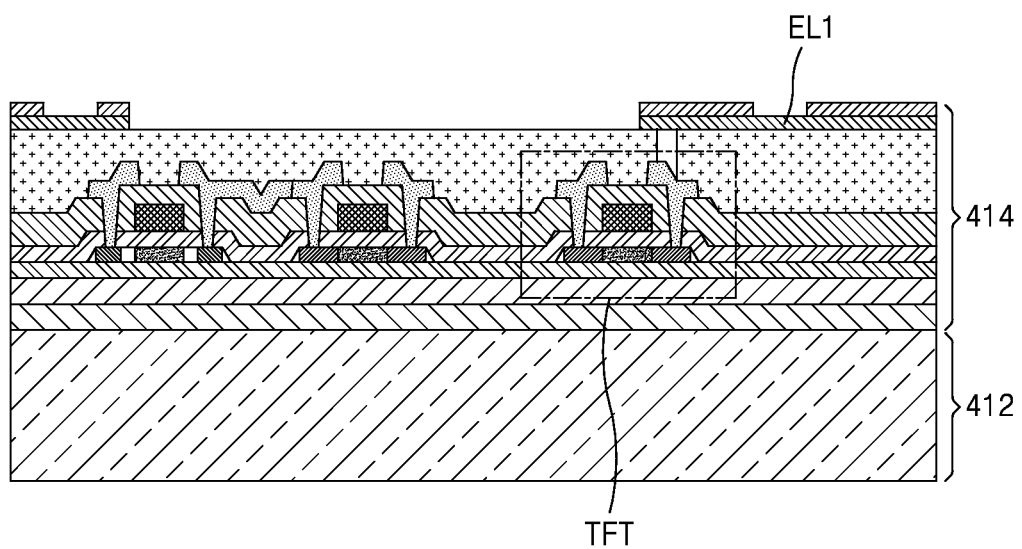
FIGS. 4A to 4E are reference views showing a process of manufacturing a display apparatus by using a light-emitting device, according to another example embodiment.

As illustrated in FIG. 4A, a driving layer 414 may be formed on a substrate 412. The driving layer 414 may include a TFT, a first electrode pattern EL1, a capacitor, and the like.

Figure 4B:
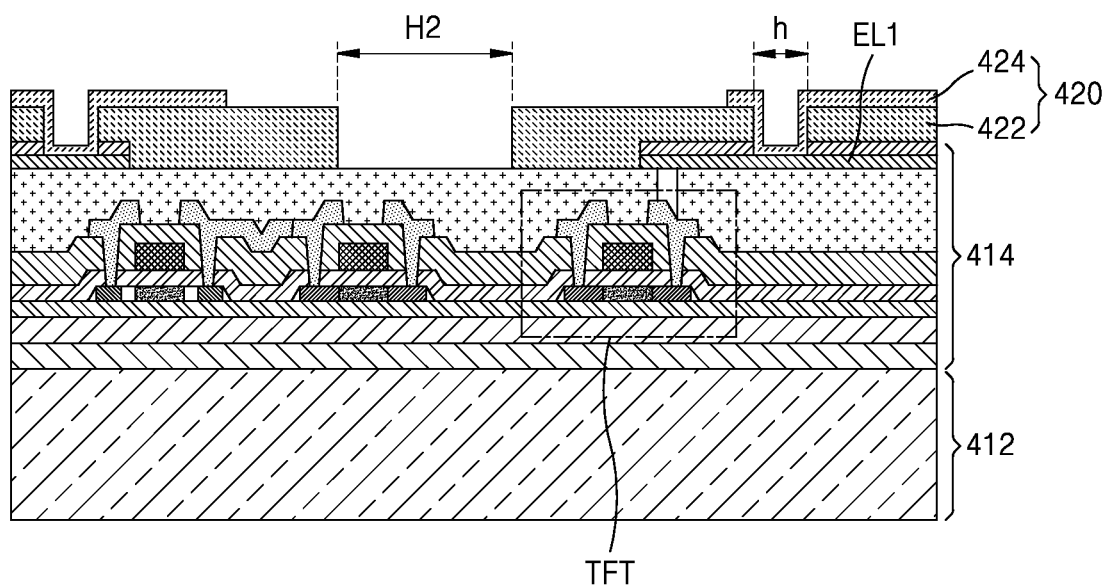

As illustrated in FIG. 4B, a partition wall 420 having a hole H2 may be formed on the driving layer 414. The partition wall 420 may include a polymer layer 422 and a metal layer 424. The metal layer 424 may be electrically connected to the first electrode pattern EL1 of the driving layer 414 via a hole h formed in the polymer layer 422. The substrate 412, the driving layer 414, and the partition wall 420 may form a transfer substrate.

Figure 4C:
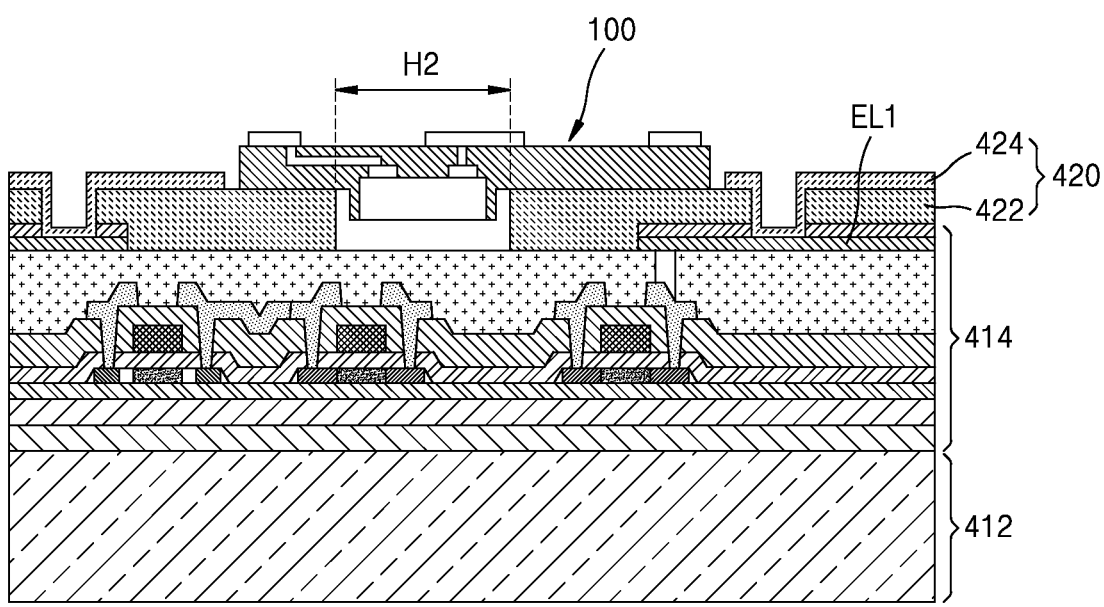

As illustrated in FIG. 4C, the light-emitting device 100 may be transferred to the inside of the hole H2. The light-emitting device 100 may be transferred by a fluidic self-assembly method, a pick and place method, or the like.

The width of the hole H2 may be less than the maximum width of the light-emitting device 100, that is, the maximum width of the extended layer 120. Accordingly, when the light-emitting device 100 is transferred to the inside of the hole H2, instead of having the light-emitting cell 110 of the light-emitting device 100 fully inserted into the hole H2, the extended layer 120 of the light-emitting device 100 may be arranged to extend to the outside of the hole H2. As described above, as the maximum width of the extended layer 120 is greater than the width of the hole H2, the light-emitting device 100 may be stably transferred to the hole H2.

When the light-emitting device 100 is inversely transferred to the inside of the hole H2, the light-emitting device 100 is erroneously transferred. As the extended layer 120 and the light-emitting cell 110 protrude too much from the hole H2, it may be easy to remove the light-emitting device 100 that is erroneously transferred.

Furthermore, when the thickness d1 of a protruding portion of the light-emitting device 100, that is, a partial portion of the first region 122, is less than the thickness d1 of the hole H2, when the light-emitting device 100 is transferred to the inside of the hole H2, the light-emitting device 100 may be arranged apart from a bottom surface of the hole H2. Such a separation space may perform as a heat dissipation function because heat radiated from the light-emitting cell 110 is dissipated through the separation space.

Figure 4D:
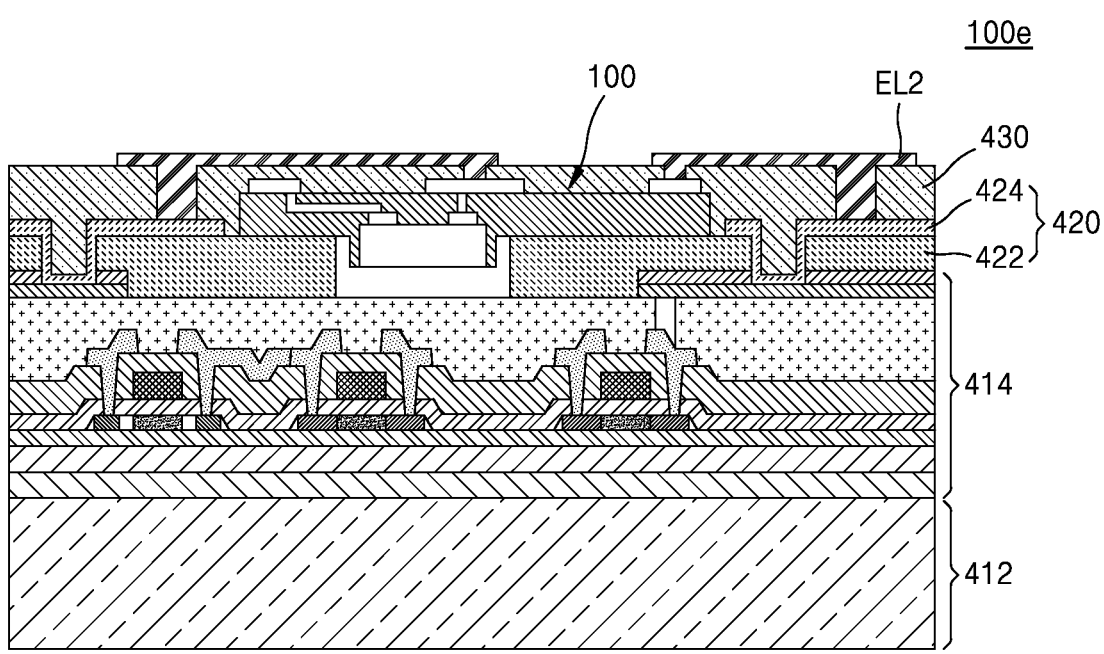

As illustrated in FIG. 4D, an insulating layer 430 that covers at least part of the light-emitting device 100 and the partition wall 420 may be formed, and a second electrode pattern EL2 that electrically connects the electrode pads 130 of the light-emitting device 100 to the driving layer 414 may be formed. The second electrode pattern EL2 may be electrically connected to the first electrode pattern EL1 of the driving layer 414 through the metal layer 424 of the partition wall 420. The insulating layer 430 may prevent infiltration of oxygen, moisture, and the like into the light-emitting device 100

Figure 4E:
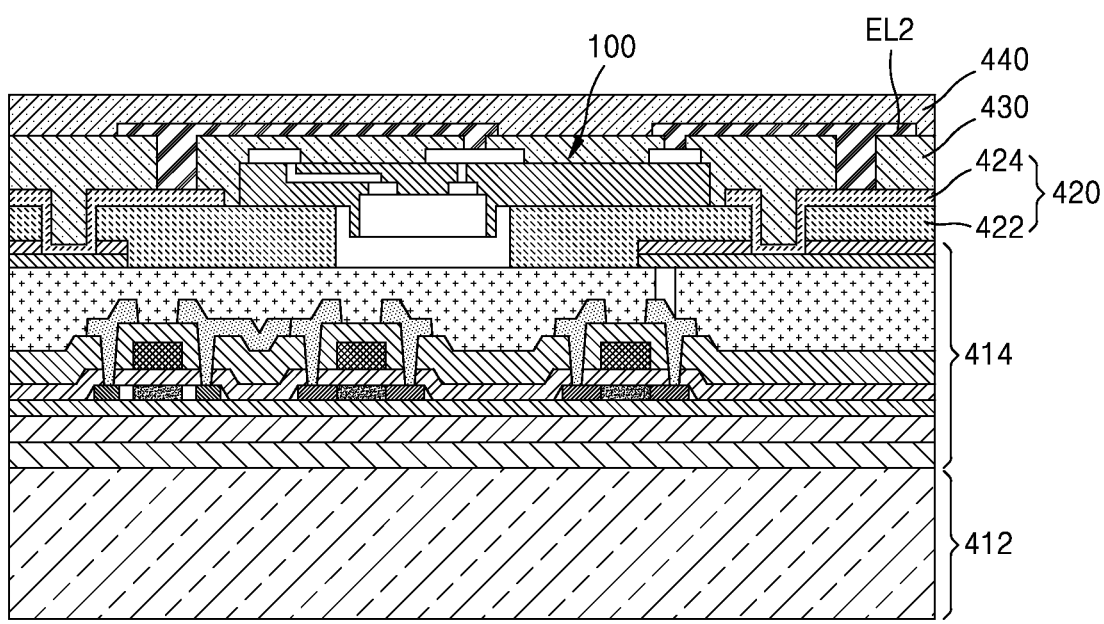

As illustrated in FIG. 4E, a planarization layer 440 may be formed on the insulating layer 430 and the second electrode pattern EL2. Then, a color conversion layer may be further formed.

Figure 5:
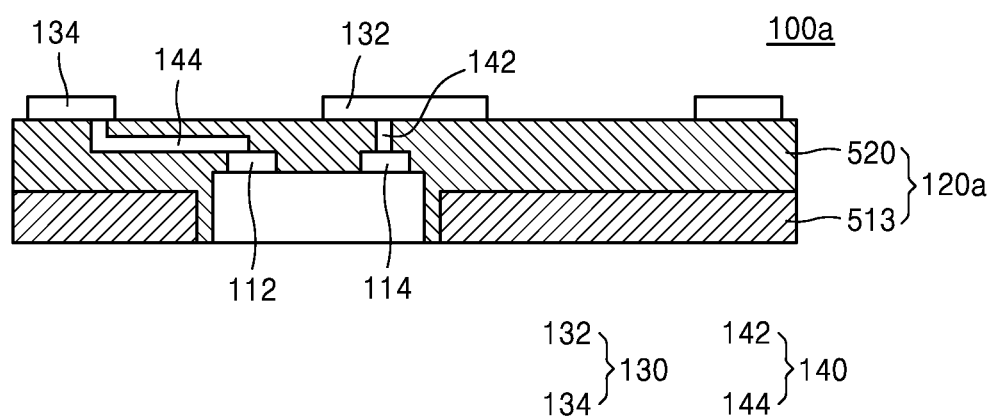
FIG. 5 illustrates a light-emitting device according to another example embodiment.

FIG. 5 illustrates a light-emitting device 100a according to another example embodiment. When comparing FIG. 1A with FIG. 5, an extended layer 120a of the light-emitting device 100a may include a different material. For example, the first region of the extended layer 120a may include a first material 520, and the second region 124 of the extended layer 120a may include the first material 520 and a second material 513. The first material 520 may include an insulating material. The first material 520 may be substantially the same material as the extended layer 120 of FIG. 1A. The second material 513 may be an insulating material, but the disclosure is not limited thereto. For example, the second material 513 may be various, for example, silicon, photoresist, and the like.

As a lower surface and a side surface of the light-emitting device 100a of FIG. 5 are flat, an optical structure such as a reflective film may be further arranged on the lower surface and the side surface. Accordingly light extraction efficiency may be increased.

Furthermore, in the light-emitting device 100a of FIG. 5, the light-emitting cell 110 is protected by the first and second materials 120 and 513, and thus, the light-emitting cell 110 may absorb impacts better than the light-emitting device 100 of FIG. 1A. Accordingly, the light-emitting cell 110 of the light-emitting device 100a of FIG. 5 may be protected by a physical force.

Figure 6A:
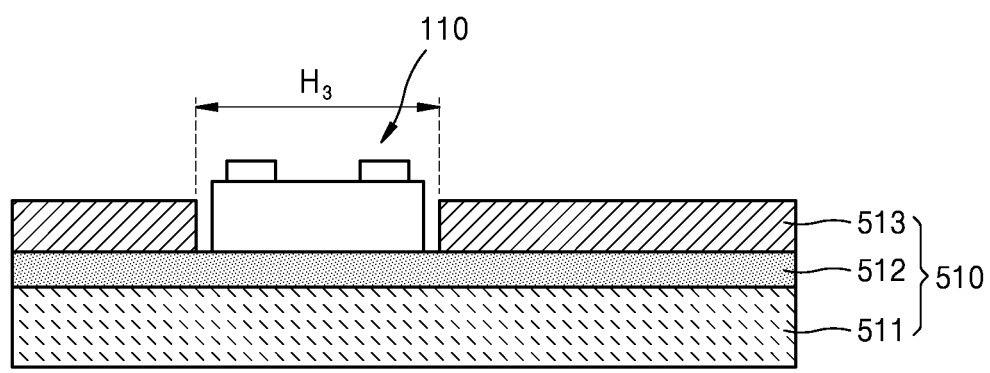
FIGS. 6A to 6C are reference views showing a method of manufacturing a light-emitting device, according to another example embodiment.
Figure 6B:
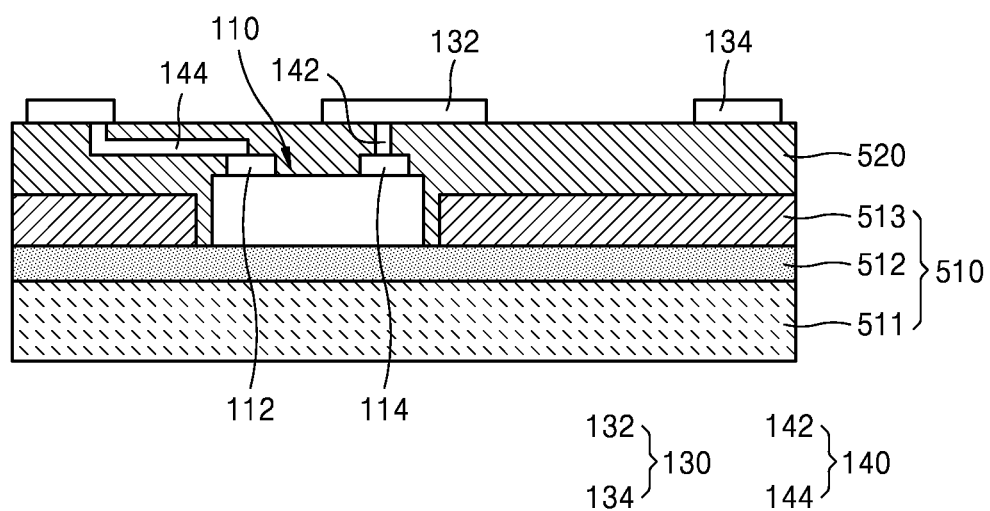
Figure 6C:
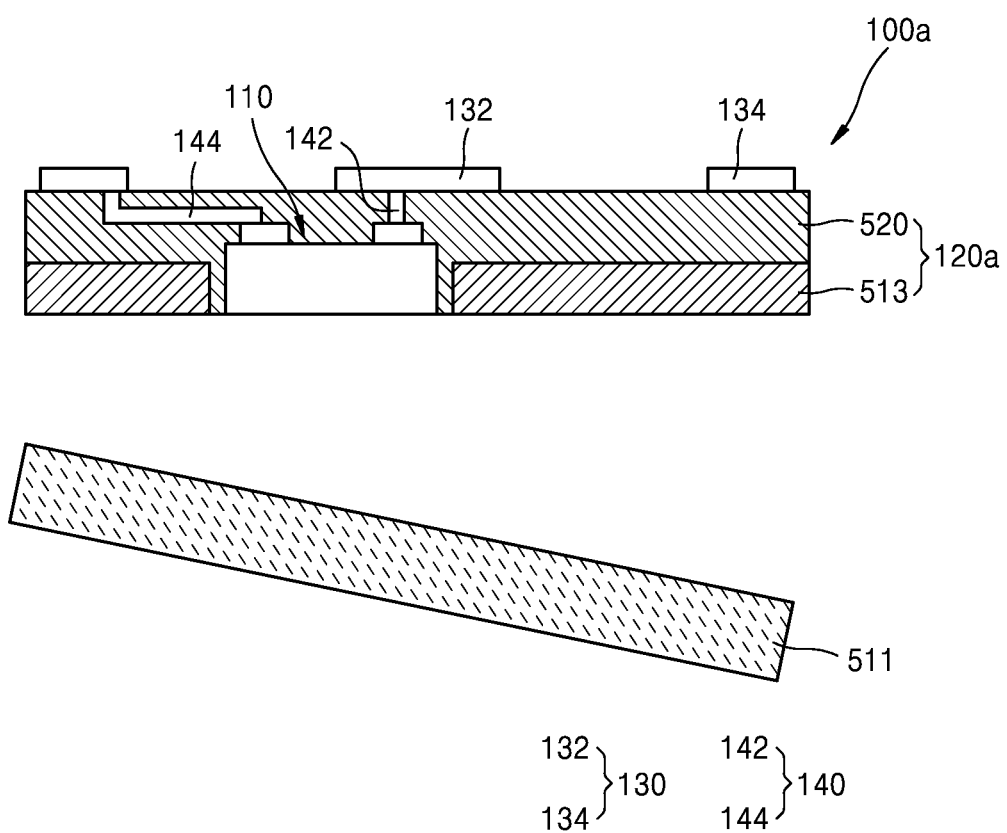

FIGS. 6A to 6C are reference views showing a method of manufacturing the light-emitting device 100a, according to another example embodiment.

As illustrated in FIG. 6A, the light-emitting cell 110 may be transferred to a substrate 510 having a groove H3. The substrate 510 may be a multilayer structure. For example, the substrate 510 may include a base layer 511, a sacrificial layer 512 arranged on the base layer 511, and a partition wall 513 having a hole. The base layer 511, the sacrificial layer 512, and the partition wall 513 may be formed on a silicon-on-insulator (SOI) substrate. However, the disclosure is not limited thereto.

The grooves H3 may have a cross-sectional area greater than the area of the light-emitting cell 110 to accommodate the light-emitting cell 110. The grooves H3 may have a shape similar to the cross-section of the light-emitting cell 110, for example, a circular cross-section or a polygonal cross-section. The grooves H3 may have a depth less than or greater than the thickness of the light-emitting cell 110, for example, a depth less than twice, or in a range of about 0.5 to 1.5 times, the thickness of the light-emitting cell 110.

The light-emitting cell 110 may be transferred by various method such as a fluidic self-assembly method, a pick and place method, or the like.

As illustrated in FIG. 6B, the first and second through-electrodes 142 and 144 and the first material 520 may be formed on the substrate 510 to which the light-emitting cell 110 is transferred. The first and second through-electrodes 142 and 144 and the first material 520 may be formed by alternately depositing a conductive material and an insulating material by using a mask. One end of the first through-electrode 142 may be formed to contact the first electrode 112, and one end of the second through-electrode 144 may be formed to contact the second electrode 114. As the first material 520 is formed, the first through-electrode 142 and the second through-electrode 144 may be formed such that the installation of the first through-electrode 142 and the second through-electrode 144 provides the effect of increasing an interval between connector electrodes of the display apparatus. At least one of the first and second through-electrodes 142 and 144 may be bent once or more, and at least one of the first and second through-electrodes 142 and 144 may extend in a direction toward the edge of the light-emitting cell 110 to be farther away from the light-emitting cell 110.

The first and second electrode pads 132 and 134 may be formed on the upper surface of the first material 520. The first electrode pad 132 may be in contact with the first through-electrode 142, and the second electrode pad 134 may be in contact with the second through-electrode 144. As the first electrode pad 132 may be arranged on the center axis of the first material 520 and the second electrode pad 134 may be arranged at the edge of the first material 520, the interval between the first and second electrode pads 132 and 134 may be greater than the interval between the first and second electrodes 112 and 114. Furthermore, the width of at least one of the first or second electrode pad 132 and 134 may be greater than the widths of the first and second electrodes 112 and 114.

As illustrated in FIG. 6C, the light-emitting device 100a may be separated from the base layer 511 by removing the sacrificial layer 512. The light-emitting device 100a and the base layer 511 may be separated from each other by applying heat to the sacrificial layer 512. The base layer 511 may be removed after the light-emitting device 100a is transferred to the target substrate 310.

Figure 7:
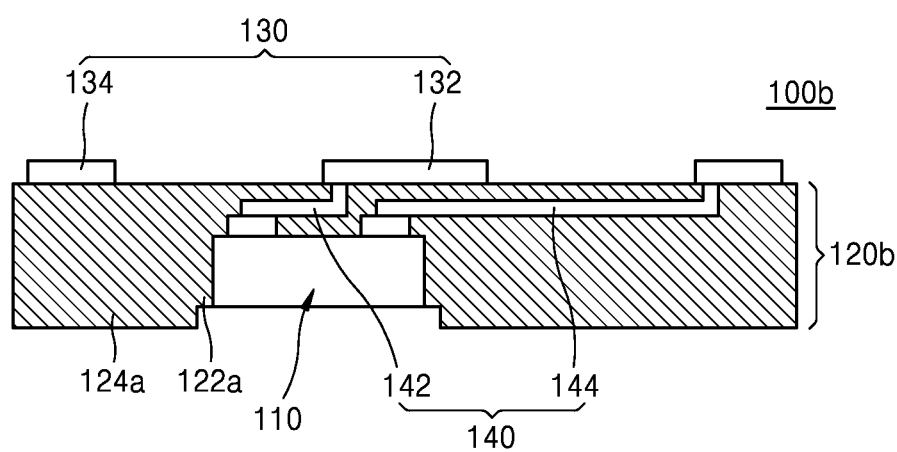
FIG. 7 illustrates a light-emitting device according to another example embodiment.

FIG. 7 illustrates a light-emitting device 100b according to another example embodiment. When comparing FIG. 1A with FIG. 7, in the light-emitting device 100b of FIG. 7, the thickness of a first region 122a of an extended layer 120b overlapping in a thickness direction of the light-emitting device 100b may be less than the thickness of a second region 124a of the extended layer 120b overlapping in in the thickness direction of the light-emitting device 100b. Accordingly, a lower space of the light-emitting cell 110 may perform a heat dissipation function. The light-emitting device 100b may be produced by using a protruding area, not the groove of a substrate. The surface of the protruding area may be hydrophilic more than the surface of the groove. The lower surface of the light-emitting cell 110 may be placed on the protruding area, the extended layer 120b and through-electrode may be formed, and the first and second electrode pads 132 and 134 may be formed on the surface of the extended layer 120b.

Although FIG. 1B illustrates that the cross-sectional shape of the light-emitting cell 110 and the cross-sectional shape of the extended layer 120 are different from each other, the disclosure is not limited thereto. The cross-sectional shapes of the light-emitting cell 110 and the extended layer 120 may be the same, and the first and second electrode pads 132 and 134 may not have shapes that are symmetrical with respect to the center axis $X_1$ of the upper surface of the extended layer 120.

Figure 8:
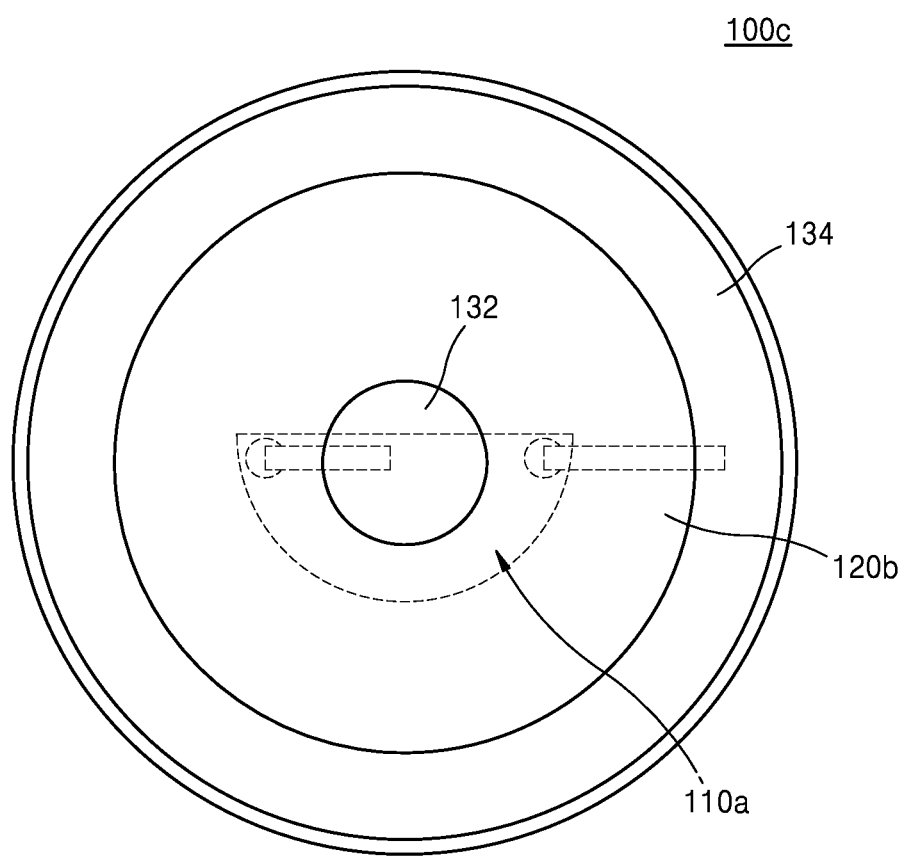
FIG. 8 is a plan view of a light-emitting device according to another example embodiment.
Figure 9:
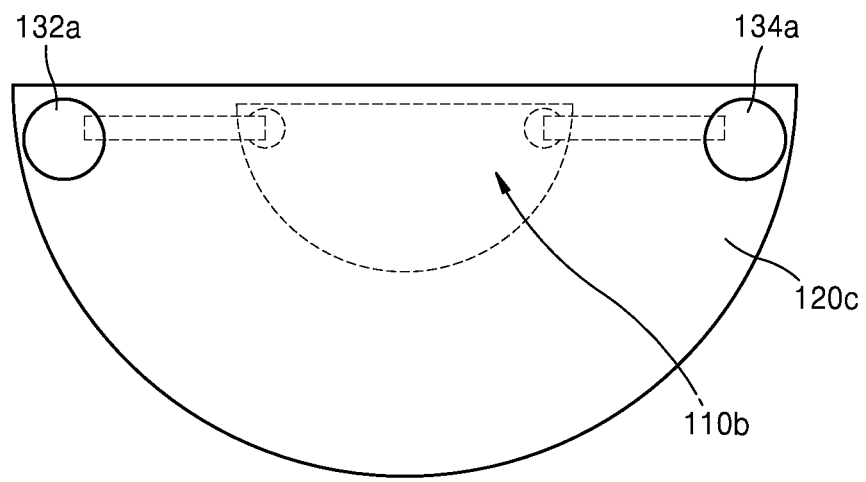
FIG. 9 is a plan view of a light-emitting device according to another example embodiment.
Figure 10:
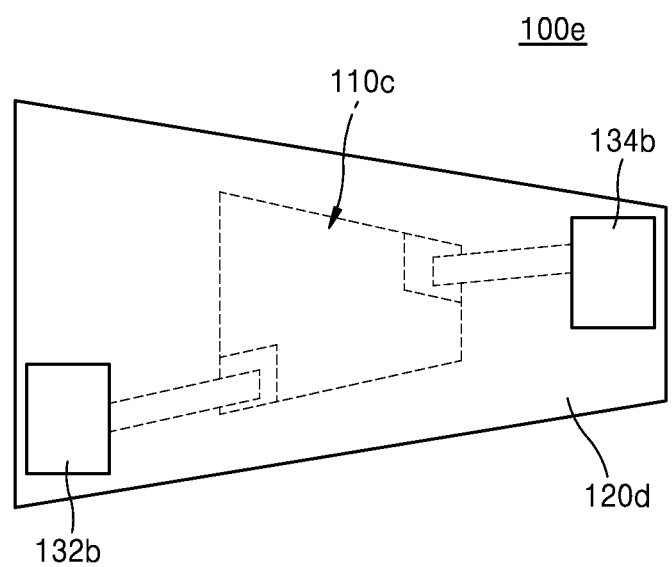
FIG. 10 is a plan view of a light-emitting device according to another example embodiment.

FIGS. 8 to 10 illustrate examples of light-emitting devices having various cross-sections. As illustrated in FIG. 8, the cross-sectional shapes of a light-emitting cell 110a and the extended layer 120b may be different from each other. For example, the light-emitting cell 110a may have a rotational asymmetric cross-section. The cross-section of the light-emitting cell 100a may have a rotational asymmetric polygonal shape. When the light-emitting cell 110a is transferred to a substrate to form the extended layer 120b after the light-emitting cell 110a is manufactured, the size of the light-emitting cell 110a is small, and thus the light-emitting cell 110a may be difficult to be transferred to the substrate. When the cross-section of the light-emitting cell 110a has a rotational asymmetric shape, if the recess of the substrate has the same shape of a rotational asymmetric cross-section, the transfer of the light-emitting cell 110 would be much easier.

The cross-section of the extended layer 120b may be rotationally symmetrical, and the first and second electrode pads 132 and 134 may have a rotationally symmetrical shape with respect to the center axis of a light-emitting device 100c. When an electronic apparatus such as a display apparatus by using the light-emitting device 100c, a rotationally symmetrical structure may facilitate a process such as electrode connection and the like.

Alternatively, as illustrated in FIG. 9, an extended layer 120c may be rotationally asymmetric with respect to the center axis of the upper surface of the extended layer 120c, like a light-emitting cell 110b. The extended layer 120c and the light-emitting cell 110b may have the same cross-sectional shape while having different sizes. When a light-emitting device 100d is transferred to a target substrate, the transfer efficiency of the light-emitting device 100d may be increased. First and second electrode pads 132a and 134a may not be arranged on the center axis of the upper surface of the extended layer 120c, and may be arranged symmetrical with respect to the center axis of the upper surface of the extended layer 120c. For example, the first and second electrode pads 132a and 134a may be arranged line symmetrical with respect to the center of the upper surface of the extended layer 120. Poor connection may be reduced by increasing the interval between the first and second electrode pads 132a and 134a.

Alternatively, as illustrated in FIG. 10, both of the an extended layer 120d and a light-emitting cell 110c may have a rotational asymmetric shape with respect to the center axis of the upper surface of the extended layer 120d. The cross-sections of the extended layer 120d and the light-emitting cell 110c may have the same shape while having different arrangement directions. When a light-emitting device 100e is transferred to a target substrate, the transfer efficiency of the light-emitting device 100e may be increased. The first and second electrode pads 132b and 134b may not be arranged on the center axis of the upper surface of the extended layer 120d, but may be arranged in symmetrical positions with respect to the center axis of the upper surface of the extended layer 120d. For example, the first and second electrode pads 132b and 134b may be arranged rotationally symmetrical to the center axis of the upper surface of the extended layer 120. Poor connection may be reduced by increasing the interval between the first and second electrode pads 132b and 134b.

Figure 11A:
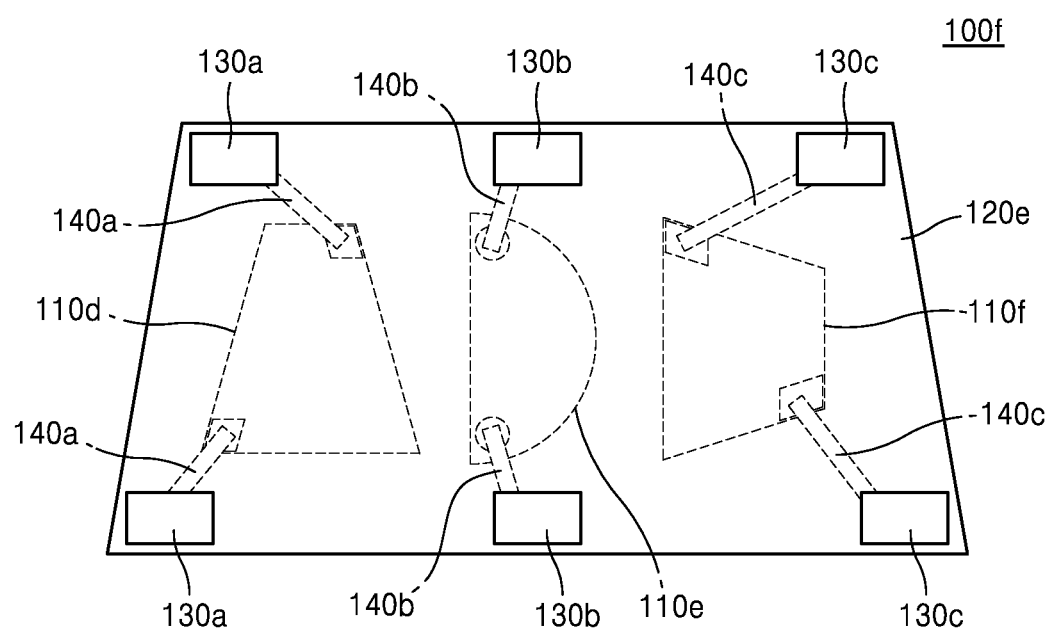
FIG. 11A is a plan view of a light-emitting device including a plurality of light-emitting cells, according to an example embodiment.
Figure 11B:
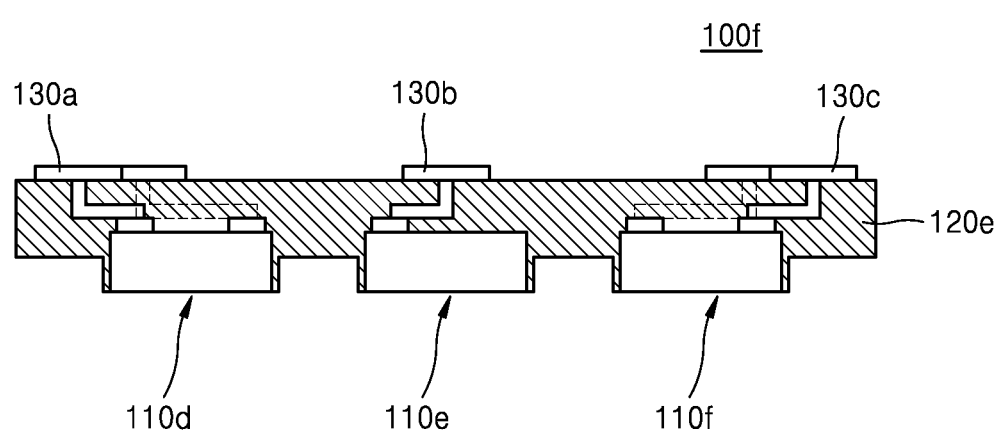
FIG. 11B is a cross-sectional view showing the light-emitting device of FIG. 11, according to an example embodiment.

FIGS. 11A and 11B illustrate a light-emitting device 100f including a plurality of light-emitting cells, according to another example embodiment. In the light-emitting device 100f, a plurality of light-emitting cells 110d, 110e, and 110f may be included in one extended layer 120e. For example, the light-emitting device 100f may include the first to third light-emitting cells 110d, 110e, and 110f that are arranged apart from one another. The first to third light-emitting cells 110d, 110e, and 110f may emit light of different wavelengths. For example, the first light-emitting cell 110d may emit red light, the second light-emitting cell 110e may emit green light, and the third light-emitting cell 110f may emit blue light. Accordingly, one light-emitting device 100f may operate as one pixel.

The cross-sectional shapes of the light-emitting cells 110d, 110e, and 110f may be different from one another according to wavelengths. Accordingly, the light-emitting cells 110d, 110e, and 110f may be transferred to a substrate for each wavelength.

A first group of electrode pads 130a electrically connected to the first light-emitting cell 110d, a second group of electrode pads 130b electrically connected to the second light-emitting cell 110e, and a third group of electrode pad 130c electrically connected to the third light-emitting cell 110f may be arranged on the upper surface of the extended layer 120f. Each of the first to third groups of electrode pads 130a, 130b, and 130c may include first and second electrode pads electrically connected to first and second electrodes of each of the light-emitting cells 110d, 110e, and 110f.

A first group of through-electrodes 140a each having one end in contact with the first light-emitting cell 110d and the other end in contact with each of the electrode pads 130a, a second group of through-electrodes 140b each having one end in contact with the second light-emitting cell 110e and the other end in contact with each of the electrode pads 130b, and a third group of through-electrodes 140c each having one end in contact with the third light-emitting cell 110f and the other end in contact with each of the electrode pads 130c may be arranged in the extended layer 120e. Each of the first to third groups of the through-electrodes 140a, 140b, and 140c may include first and second through-electrodes respectively electrically connected to first and second electrodes of each of the light-emitting cells 110d, 110e, and 110f. As one light-emitting device 100f becomes one pixel, a display apparatus may be easily manufactured.

Figure 12:
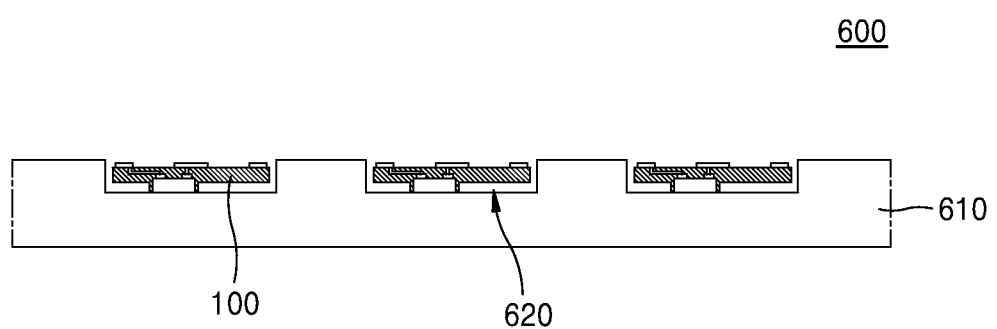
FIG. 12 is a cross-sectional view showing a schematic structure of a display transfer structure including a light-emitting device, according to an example embodiment.

FIG. 12 is a cross-sectional view showing a schematic structure of a display transfer structure 600 including the light-emitting device 100, according to an example embodiment.

The display transfer structure 600 may include a transfer substrate 610 including a plurality of recesses 620 and the light-emitting device 100 arranged in each of the recesses 620.

The transfer substrate 610 may include, for example, an organic material, an inorganic material such as silicon, glass, or polymer, and the like. The transfer substrate 610 may be formed in a single layer or in a plurality of layers.

The recesses 620 may each have a cross-sectional area larger than the size of the light-emitting device 100 to accommodate the light-emitting device 100. The cross-sectional size of each of the recesses 620 may be greater than the cross-sectional size of the light-emitting device 100 and less than twice of the cross-sectional size of the light-emitting device 100. Accordingly, one light-emitting device 100 may be arranged in each of the grooves 620. The grooves 620 may each have a shape similar to the cross-section of the light-emitting device 100, for example, a circular cross-section or a polygonal cross-section.

The thickness of each of grooves 620 may be similar to the maximum thickness of the light-emitting device 100. For example, the thickness of each of the grooves 620 may be about 0.5 times or more or about 1.5 times or less than the thickness of the light-emitting device 100.

The upper surface of the transfer substrate may have a fine structure or the chemical properties different from the surfaces in the grooves 620. For example, the upper surface of the transfer substrate may have relatively large surface roughness, may have a small relative area in contact with the surface of the light-emitting device or relatively hydrophobic due to a fine pattern, or may be relatively hydrophobic. Meanwhile, such a property difference may assist the electrodes of the light-emitting device 100 to be aligned in a certain direction, that is, in the outward direction of the grooves 620, and on the other hand, may reduce the amount of the light-emitting device 100 that remains without being transferred to the grooves 620 or may allow the remaining device to be easily separated from the transfer substrate 610 in a cleaning operation.

Figure 13:
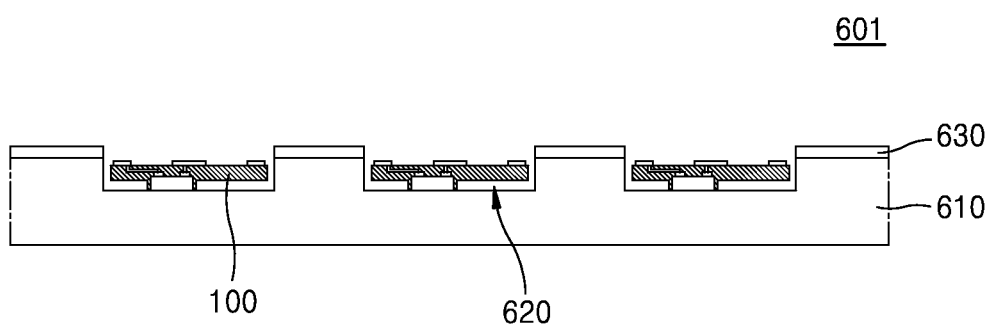
FIG. 13 illustrates a display transfer structure according to another example embodiment.

FIG. 13 illustrates a display transfer structure 601 according to another example embodiment. When comparing FIG. 12 with FIG. 13, the display transfer structure 601 of FIG. 13 may further include a coating layer 630 additionally on the outer surface of the transfer substrate 610, the surface of the coating layer 630 may have the physical and chemical properties different from those of the surfaces in the grooves 620.

The coating layer 630 may include a metal such as Ag, Au, Pt, Ni, Cr, and/or Al, and the type of a metal or process conditions may be selected such that a surface energy difference from the transfer substrate 610 increases. The coating layer 630 is also available in a form in which a polymer is further bonded to a metal layer or only a polymer is coated. The surface roughness may be increased or a contact area with the light-emitting device may be reduced through additional patterning or surface treatment on the coating layer.

The above-described display transfer structures 600 and 601 may be applied to a display apparatus using the light-emitting device 100. The light-emitting devices 100 provided in the above-described display transfer structures 600 and 601 may include a plurality of LED chips for emitting red light (R), green light (G), and blue light (B), or may consist of a plurality of LED chips for emitting blue light (B) only. The display transfer structures 600 and 601 may be applied to a display apparatus in which the light-emitting devices 100 operate as individual pixels, for example, an RGB self-emitting micro LED TV. In this case, the display transfer structures 600 and 601 may be used as display apparatuses as a whole, or the light-emitting devices 100 provided in the display transfer structures 600 and 601 may be transferred to a TFT substrate by bonding such as eutectic bonding, ACF bonding, or the like.

Figure 14:
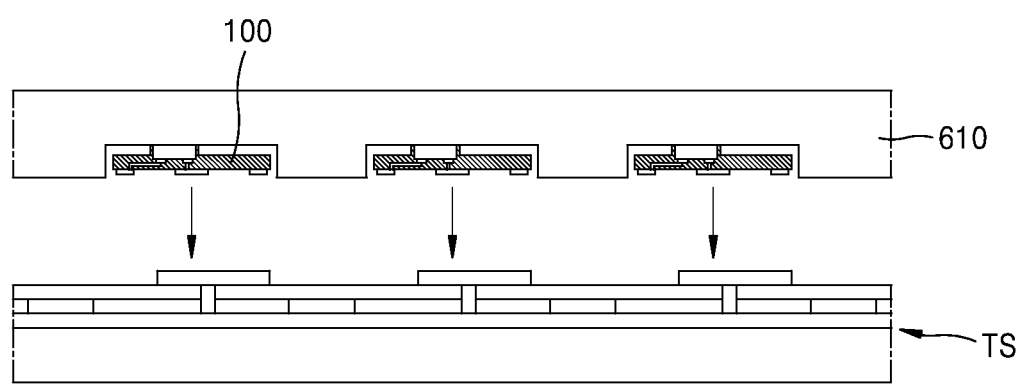
FIG. 14 illustrates that a light-emitting device provided in a display transfer structure is transferred to a TFT substrate, according to an example embodiment.

FIG. 14 illustrates that the light-emitting device 100 provided in the display transfer structure 610 is transferred to a TFT substrate TS, according to an example embodiment.

As illustrated in FIG. 14, the display transfer structure 610 may serve as a transfer mold for transferring the light-emitting device 100 to another position. The light-emitting device 100 may be bonding-transfer to the TFT substrate TS on which a driving circuit such as a TFT for driving the light-emitting device 100, and the like. As the light-emitting device 100 is aligned in each of the grooves 620 of the transfer substrate 610, the light-emitting device 100 may be well transferred to a set position on the TFT substrate TS. After the light-emitting device 100 is bonding-transferred to the TFT substrate TS, a display apparatus may be completed through an additional process. The manufacturing yield of a display apparatus may be improved by using the display transfer structure 600 according to an example embodiment.

Figure 15:
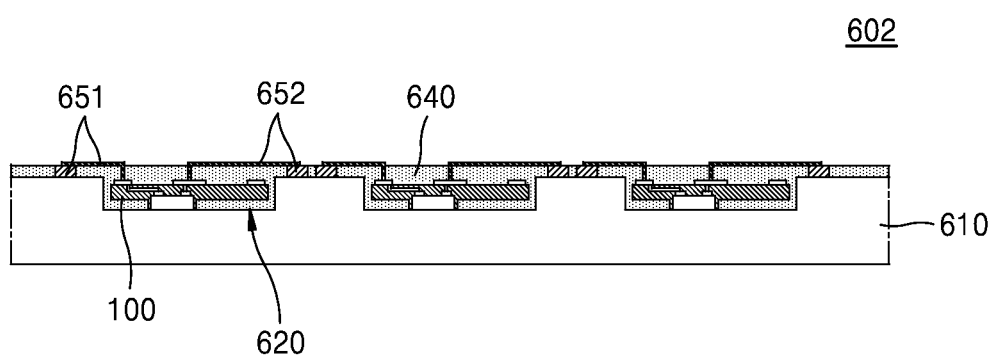
FIG. 15 is a cross-sectional view showing a schematic structure of a display transfer structure, according to another example embodiment.
Figure 16:
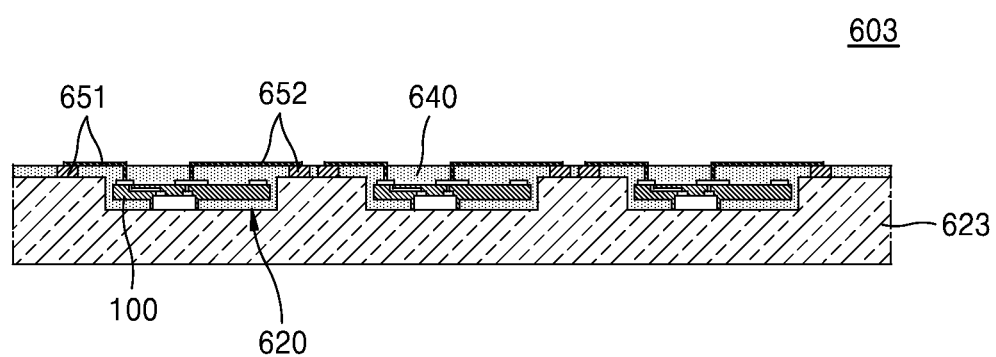
FIG. 16 is a cross-sectional view showing a schematic structure of a display transfer structure, according to another example embodiment.
Figure 17:
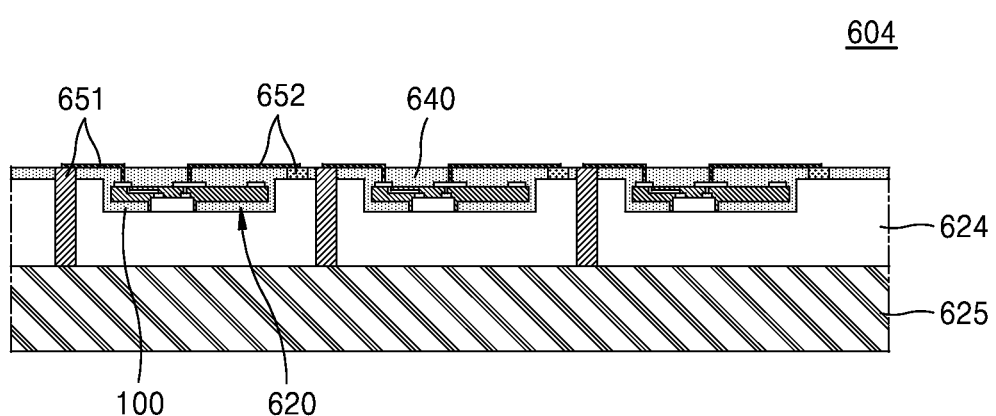
FIG. 17 is a cross-sectional view showing a schematic structure of a display transfer structure, according to another example embodiment.

The display transfer structure may be directly applied to a display apparatus. FIGS. 15 to 17 show display transfer structures 602, 603, and 604 in which an additional structure to be directly applied to a display apparatus is further provided.

FIG. 15 is a cross-sectional view showing a schematic structure of a display transfer structure 602, according to another example embodiment.

The display transfer structure 602 of the present embodiment may have a shape in which an additional material layer is further provided in the display transfer structure 600 of FIG. 12.

The display transfer structure 602 may further include an insulating layer 640 formed in the grooves 620 and circuit elements 651 and 652 connected to the first electrode pad 132 and the second electrode pad 134 of the light-emitting device 100. The circuit elements 651 and 652 may form part of a driving circuit for driving the light-emitting device 100.

FIG. 16 is a cross-sectional view showing a schematic structure of a display transfer structure 603, according to another example embodiment.

The display transfer structure 603 of the present embodiment is different from the display transfer structure 600 in that a circuit substrate 623 having a driving circuit for driving the light-emitting device 100 is used as a transfer substrate. The circuit substrate 623 may include circuit elements including a driving transistor, a switch transistor, a capacitor, and the like. To align the light-emitting device 100 at a regular position, after the grooves 620 is directly formed on a circuit substrate 123, the light-emitting device 100 is aligned in the grooves 620 on a wet alignment method. Accordingly, the additional process may be reduced and the display transfer structure 603 may be used as a display apparatus.

FIG. 17 is a cross-sectional view showing a schematic structure of a display transfer structure 604, according to another example embodiment.

The display transfer structure 604 of the present embodiment may include a circuit substrate 625 arranged below a transfer substrate 624. The circuit substrate 625 may include circuit elements including a driving, transistor, a switch transistor, a capacitor, and the like, and the circuit elements of the circuit substrate 625 may be electrically connected to the light-emitting device 100 through a conductive via Via that penetrates the transfer substrate 624.

Figure 18:
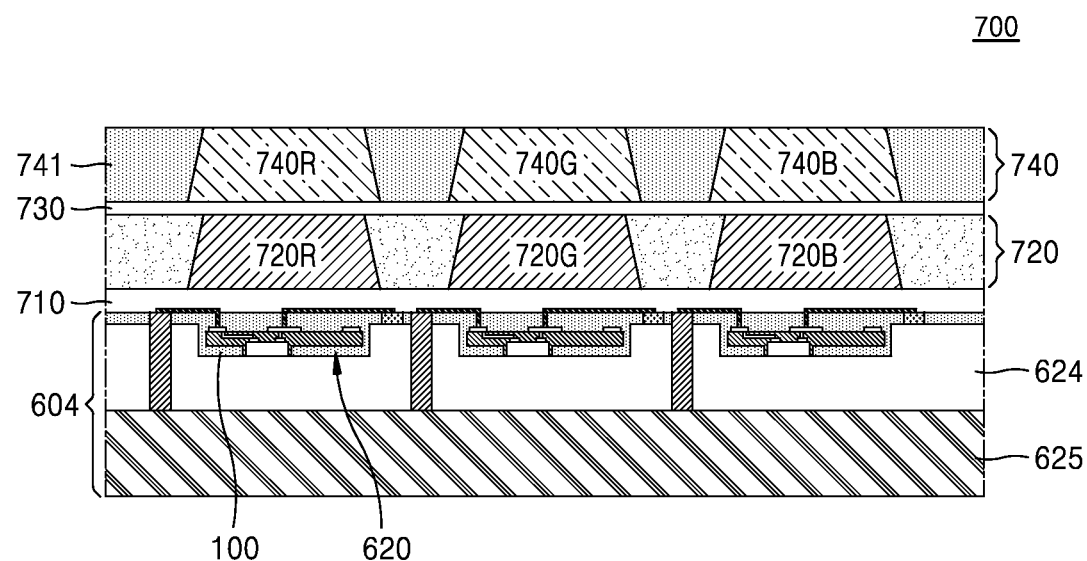
FIG. 18 is a cross-sectional view showing a schematic structure of a display apparatus, according to an example embodiment.

FIG. 18 is a cross-sectional view showing a schematic structure of a display apparatus 700, according to an example embodiment.

The display apparatus 700 may include a display transfer structure 604 in which the light-emitting device 100 is arranged in each of the grooves 620, and a color conversion layer 720 arranged on the display transfer structure 604.

Although the display transfer structure 604 that is illustrated in FIG. 17 as an example, the disclosure is not limited thereto and may be modified into the display transfer structure 602 of FIG. 15, the display transfer structure 603 of FIG. 16, or any modified form therefrom.

A passivation layer 710 including an insulating material may be arranged on the display transfer structure 604, and the color conversion layer 720 may be arranged on the passivation layer 710.

The color conversion layer 720 may include a first color conversion layer 720B for converting the light from the light-emitting device 100 to first color light, a second color conversion layer 720G for converting the light to second color light, and a third color conversion layer 720R for converting the light to third color light. The first color light may be, for example, blue light, the second color light may be, for example, green light, and the third color light may be, for example, red light. The first color conversion layer 720B, the second color conversion layer 720G, and the third color conversion layer 720R may be arranged apart from one another with a partition wall therebetween and to face the light-emitting device 100.

A capping layer 730 may be arranged on the color conversion layer 720, and a color filter layer 740 may be arranged on the capping layer 730. The color filter layer 740 may include a first filter 740B, a second filter 740G, a third filter 740R, which are apart from one another with a black matrix 741 therebetween. The first filter 7408, the second filter 740G, and the third filter 740R may be arranged to face the first color conversion layer 720B, the second color conversion layer 720G, and the third color conversion layer 720R, respectively. The first filter 740B, the second filter 740G, and the third filter 740R may respectively transmit blue light, green light, and red light, and may absorb light of other colors. The color filter layer 740 may be omitted.

A display apparatus including any of the above-described light-emitting devices 100, 100a, 100b, 100c, 100d, 100e, and 100f may be employed in various electronic apparatuses. For example, the display apparatus may be applied to TVs, notebook computers, mobile phones, smartphones, smartpads (PDs), portable multimedia players (PMPs), personal digital assistants (PDAs), navigations, smart watches, head mounted displays, signatures, and the like.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A light-emitting device comprising:
a light-emitting cell comprising a first electrode and a second electrode that are provided on an upper surface of the light-emitting cell, a lower surface of the light-emitting cell being exposed to outside of an extended layer of the light-emitting device;
the extended layer in which the light-emitting cell is embedded and which has a width greater than a width of the light-emitting cell; and
a first electrode pad and a second electrode pad that are provided on an upper surface of the extended layer, and are electrically connected to the first electrode and the second electrode,
wherein an interval between the first electrode pad and the second electrode pad is greater than an interval between the first electrode and the second electrode,
wherein at least one of the first electrode or the second electrode does not entirely overlap the first electrode pad and the second electrode pad, in a thickness direction of the light-emitting device,
wherein the first electrode pad is on a center axis of the extended layer,
wherein the second electrode pad is spaced apart from and at least partially surrounds the first electrode pad, and is symmetric with respect to the center axis of the extended layer.

2. The light-emitting device of claim 1, wherein the second electrode pad does not overlap the first electrode and the second electrode in the thickness direction of the light-emitting device.

3. The light-emitting device of claim 1, wherein at least one of the first electrode pad or the second electrode pad is line symmetrical or rotationally symmetrical to the center axis of the light-emitting device.

4. The light-emitting device of claim 1, wherein the interval between the first electrode pad and the second electrode pad is 1.5 times or more than the interval between the first electrode and the second electrode.

5. The light-emitting device of claim 1, wherein a width of at least one of the first electrode pad or the second electrode pad is greater than a width of the first electrode and the second electrode.

6. The light-emitting device of claim 1, wherein a center axis of the light-emitting device does not match a center axis of the light-emitting cell.

7. The light-emitting device of claim 1, wherein the light-emitting cell has a rotational asymmetric shape with respect to a center axis of the light-emitting cell.

8. The light-emitting device of claim 7, wherein the light-emitting cell has a polygonal cross-sectional shape.

9. The light-emitting device of claim 1, wherein the first electrode and the second electrode are spaced apart from each other with a center axis of the light-emitting cell therebetween.

10. The light-emitting device of claim 1, wherein the extended layer comprises a first region arranged at a center of the light-emitting device and a second region surrounding the first region, and
wherein the light-emitting cell is embedded in the first region.

11. The light-emitting device of claim 10, wherein a thickness of the first region is greater than a thickness of the second region.

12. The light-emitting device of claim 1, further comprising:
a first through-electrode penetrating the extended layer and having a first end in contact with the first electrode and a second end in contact with the first electrode pad; and
a second through-electrode penetrating the extended layer and having a third end in contact with the second electrode and a fourth end in contact with the second electrode pad.

13. The light-emitting device of claim 12, wherein at least one of the first through-electrode or the second through-electrode is bent once or more.

14. The light-emitting device of claim 12, wherein a partial area of the second through-electrode at least partially overlaps the first electrode pad in the thickness direction of the light-emitting device.

15. The light-emitting device of claim 1, wherein the light-emitting cell comprises a plurality of sub-light-emitting cells configured to emit light of different wavelengths, and
each of the first electrode pad and the second electrode pad comprises a plurality of sub electrode pads respectively electrically connected to the plurality of sub-light-emitting cells.

16. A display apparatus comprising:
a display layer comprising a plurality of light-emitting devices; and
a driving layer comprising a plurality of transistors electrically connected to the plurality of light-emitting devices to drive the plurality of light-emitting devices,
wherein at least one of the plurality of light-emitting devices comprises:
a light-emitting cell comprising a first electrode and a second electrode provided on an upper surface of the at least one of the plurality of light-emitting devices, a lower surface of the light-emitting cell being exposed to outside of an extended layer of the at least one of the plurality of light-emitting devices;
the extended layer in which the light-emitting cell is embedded and which has a width greater than a width of the light-emitting cell; and
a first electrode pad and a second electrode pad provided on an upper surface of the extended layer and respectively electrically connected to the first electrode and the second electrode,
wherein an interval between the first electrode pad and the second electrode pad is greater than an interval between the first electrode and the second electrode, and at least one of the first electrode or the second electrode does not entirely overlap the first electrode pad and the second electrode pad, in a thickness direction of the at least one of the plurality of light-emitting devices,
wherein the first electrode pad is on a center axis of the extended layer, and
wherein the second electrode pad is spaced apart from and at least partially surrounds the first electrode pad, and is symmetric with respect to the center axis of the extended layer.

17. The display apparatus of claim 16, wherein the display layer further comprises a partition wall provided on the driving layer and having a plurality of holes,
the light-emitting cell is provided in one of the plurality of holes, and
an edge region of the extended layer is arranged on an upper surface of the partition wall.

18. A display apparatus comprising:
a light-emitting cell comprising a plurality of electrodes, a lower surface of the light-emitting cell being exposed to outside of an extension layer of the display apparatus;
the extension layer that covers a top surface of the light-emitting cell and the plurality of electrodes of the light-emitting cell;
a first electrode pad and a second electrode pad that are provided on the top surface of the extension layer, wherein the first electrode pad is disposed directly above the light-emitting cell, and the second electrode pad has a circular ring shape to surround the first electrode pad; and
a plurality of through-electrodes that pass through the extension layer to connect the first electrode pad and the second electrode pad to the plurality of electrodes of the light-emitting cell, respectively,
wherein the first electrode pad and the second electrode pad are spaced from the light-emitting cell in a vertical direction of the display apparatus,
wherein an interval between the first electrode pad and the second electrode pad is greater than an interval between the plurality of electrodes of the light-emitting cell in a horizontal direction of the display apparatus,
wherein the first electrode pad is on a center axis of an extended layer, and
wherein the second electrode pad is spaced apart from and at least partially surrounds the first electrode pad, and is symmetric with respect to the center axis of the extended layer.

19. A method of manufacturing a light-emitting device comprising:
preparing a substrate comprising a plurality of grooves;
transferring each of a plurality of light-emitting cells to the plurality of grooves such that a first electrode and a second electrode of each of the plurality of light-emitting cells are spaced apart faces out of the plurality of grooves;
forming a first through-electrode, a second through-electrode and an extended layer on a surface of each of the plurality of light-emitting cells, each of the first through-electrode and the second through-electrode in contact with the first electrode and the second electrode, a lower surface of each of the plurality of light-emitting cells being exposed to outside of the extended layer; and forming a first electrode pad and a second electrode pad on the extended layer, each of the first electrode pad and the second electrode pad being in contact with the first through-electrode and the second through-electrode, wherein an interval between the first electrode pad and the second electrode pad is greater than an interval between the first electrode and the second electrode, wherein at least one of the first electrode or the second electrode does not entirely overlap the first electrode pad and the second electrode pad, in a thickness direction of the light-emitting device, wherein the first electrode pad is on a center axis of the extended layer, and wherein the second electrode pad is spaced apart from and at least partially surrounds the first electrode pad, and is symmetric with respect to the center axis of the extended layer.

20. The method of claim 19, wherein the second electrode pad does not overlap the first electrode and the second electrode in the thickness direction of the light-emitting device.

21. The method of claim 19, wherein a width of at least one of the first electrode pad or the second electrode pad is greater than a width of the first electrode and the second electrode.

22. The method of claim 19, wherein a center axis of the light-emitting device does not match a center axis of the plurality of light-emitting cells.

* * * * *